(12) United States Patent
Matsumoto et al.

(10) Patent No.: US 6,455,894 B1
(45) Date of Patent: Sep. 24, 2002

(54) SEMICONDUCTOR DEVICE, METHOD OF MANUFACTURING THE SAME AND METHOD OF ARRANGING DUMMY REGION

(75) Inventors: Takuji Matsumoto, Tokyo (JP); Toshiaki Iwamatsu, Tokyo (JP); Yuuichi Hirano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/677,881

(22) Filed: Oct. 3, 2000

(30) Foreign Application Priority Data

Apr. 3, 2000 (JP) ........................................ 2000-100437

(51) Int. Cl.$^7$ ............................................... H01L 27/01
(52) U.S. Cl. ........................ 257/347; 257/349; 257/507; 438/295
(58) Field of Search ................................ 257/347, 349, 257/507; 438/295, 311, 479, 926

(56) References Cited

U.S. PATENT DOCUMENTS

| 5,767,549 | A | * | 6/1998 | Chen et al. | .................. | 257/347 |
| 6,020,616 | A | * | 2/2000 | Bothra et al. | ................ | 257/381 |
| 6,130,139 | A | * | 10/2000 | Ukeda et al. | ................ | 438/424 |
| 6,281,593 | B1 | * | 8/2001 | Brown et al. | ................ | 257/901 |
| 6,337,230 | B2 | * | 1/2002 | Hirano | ......................... | 438/149 |
| 6,414,354 | B1 | * | 7/2002 | Hirano | ......................... | 257/347 |

FOREIGN PATENT DOCUMENTS

| JP | 8-32039 | 2/1996 |
| JP | 10-321549 | 12/1998 |

OTHER PUBLICATIONS

Y. Hirano, et al., 1999 IEEE International SOI Conference, pp. 131–132, "Bulk–Layout–Compatible 0.18μm SOI–CMOS Technology Using Body–Fixed Partial Trench Isolation (PTI)", Oct. 1999.

Y. Hirano, et al., Proceedings of the 57th Symposium on Semiconductors and Integrated Circuits Technology, pp. 19 to 24, "Bulk–Layout–Compatible 0.18μM SOI–CMOS Technology Using Body–Tied Partial Trench Isolation (PTI)", Dec. 9–10, 1999.

T. Matsumoto, et al., Extended Abstracts of the 1999 International Conference on Solid State Devices and Materials, pp. 340–341, "Clarification of Floating–Body Effects on Current Drivability in Deep Sub–Quarter Micron Partially–Depleted SOI MOSFET's", 1999.

* cited by examiner

Primary Examiner—Richard Elms
Assistant Examiner—Christian D. Wilson
(74) Attorney, Agent, or Firm—Oblon, Spivak, McClelland, Maier & Neustadt, P.C.

(57) ABSTRACT

Provided are a semiconductor device capable of satisfactorily solving a floating-body problem and a hot carrier problem which often arise in an SOI device and of causing a widely distributed partial isolating film to generate a crystal defect for peripheral structures with difficulty and a method of manufacturing the semiconductor device. A dummy region DM1 having no function as an element is formed at almost regular intervals in a partial isolating film 5b provided between MOS transistors TR1. Consequently, the occupation rate of the dummy region DM1 having a lower resistance value than that of a silicon layer 3b provided under the partial isolating film 5b is increased so that the floating-body problem and the hot carrier problem can be solved.

10 Claims, 47 Drawing Sheets

F I G. 14
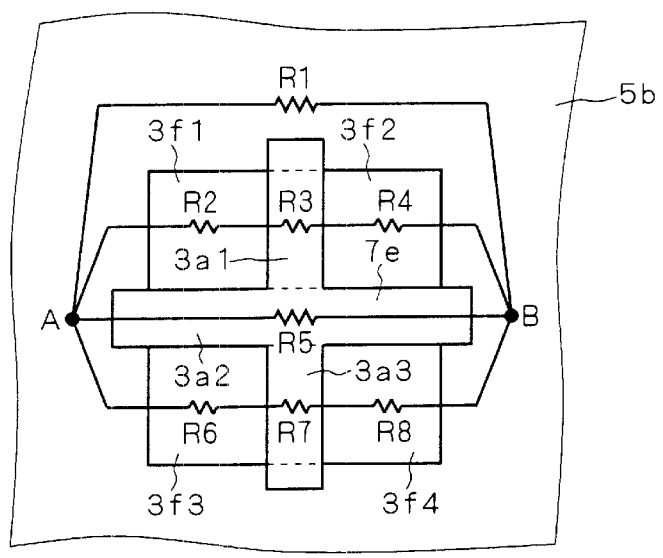
F I G. 15
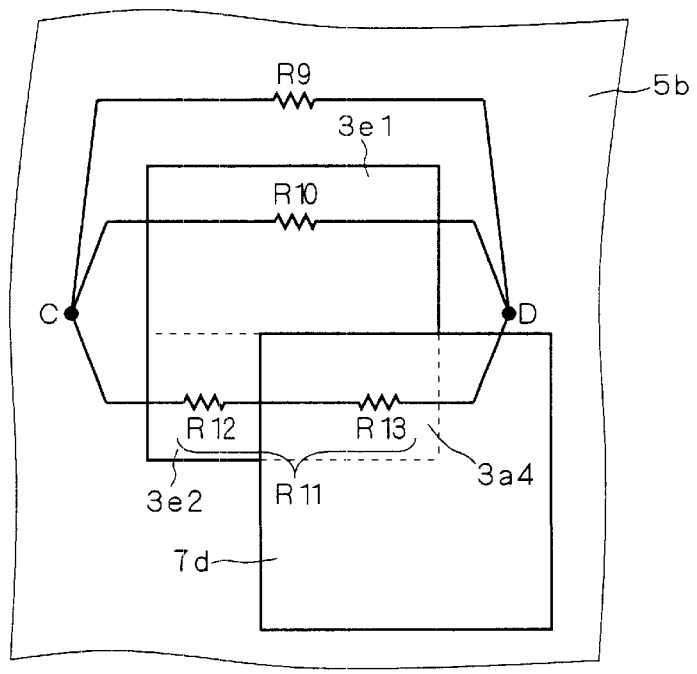

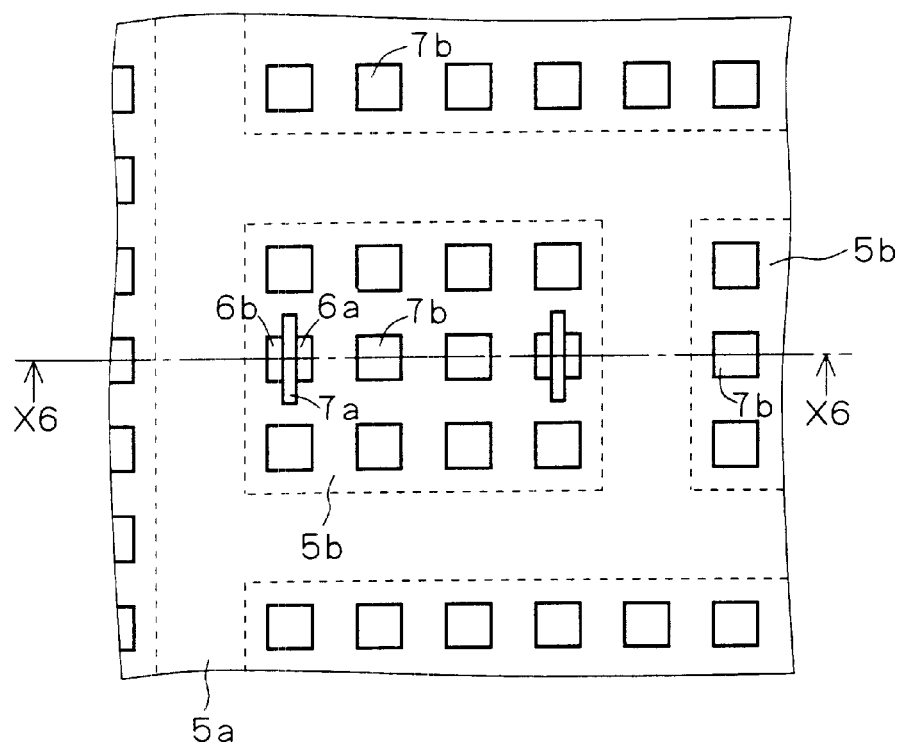
F I G. 1 6

F I G. 22
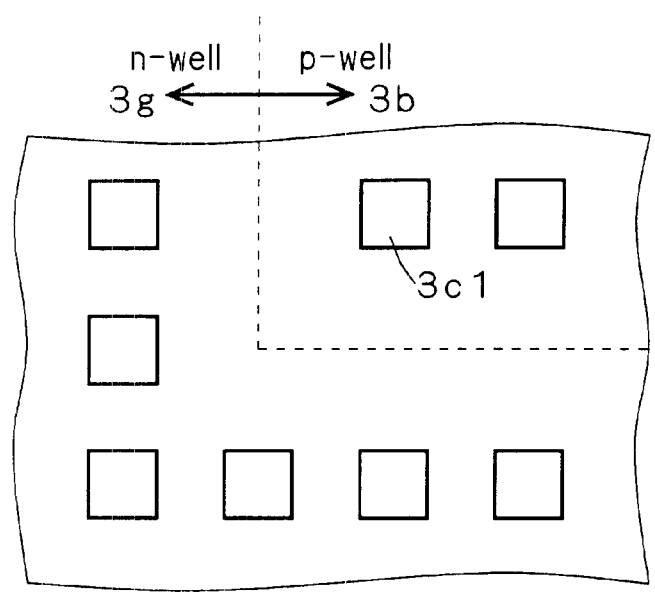

SEMICONDUCTOR DEVICE, METHOD OF MANUFACTURING THE SAME AND METHOD OF ARRANGING DUMMY REGION

BACKGROUND OF THE INVENTION

1. Field of the Invention

The present invention relates to a semiconductor device (SOI device) comprising an SOI (Silicon On Insulator) substrate and a semiconductor element formed on the SOI substrate, and a method of manufacturing the semiconductor device.

2. Description of the Background Art

In recent years, attention has been paid to the SOI device because it can be utilized as a high speed device having low power consumption. The SOI substrate includes a substrate formed of silicon or the like, a buried insulating film such as an oxide film which is formed on the substrate and a silicon layer formed on the buried insulating film. A semiconductor element is formed on at least one of the inner portion or surface of the silicon layer in the SOI substrate. Consequently, the SOI device functions as a semiconductor device.

In recent years, particularly, attention has been paid to a so-called thin film SOI device in which a silicon layer in an SOI substrate has a small thickness of approximately several μm. The application of the thin film SOI device to an LSI for portable equipment and the like has been expected.

FIG. 45 shows an example of a conventional SOI device. In FIG. 45, the reference numeral 1 denotes a substrate constituting the SOI substrate, the reference numeral 2 denotes a buried insulating film constituting the SOI substrate, and the reference numeral 3a denotes a part of a silicon layer constituting the SOI substrate. A plurality of MOS transistors TR1 are formed as an example of the semiconductor element in the silicon layer 3a and on a surface thereof. By way of example, the MOS transistor TR1 is an n-channel type. In order to function as a body region and a channel formation region, the silicon layer 3a is provided with a well in which a p-type impurity is injected, for example.

The MOS transistor TR1 includes a drain region 6a and a source region 6b which are formed in the silicon layer 3a and a gate insulating film 4a and a gate electrode 7a which are formed on a surface of the silicon layer 3a. The gate insulating film 4a is an insulating film such as an oxide film, and the gate electrode 7a is a conductive film such as polysilicon or a metal film. The silicon layer 3a interposed between the drain region 6a and the source region 6b functions as a body region of the MOS transistor TR1. In order to reduce a resistance, silicide regions 9a, 10a and 10b such as CoSi or TiSi are formed on surfaces of the gate electrode 7a, the drain region 6a and the source region 6b, respectively. A side wall 8 which has been used for forming an extension region in the drain region 6a and the source region 6b is formed on a side surface of the gate electrode 7a. As an example, FIG. 45 shows the case in which the drain region 6a and the source region 6b are provided deeply in contact with the buried insulating film 2.

Furthermore, an isolating film 5a comprising an insulating film such as an oxide film is formed between the MOS transistors TR1 in order to electrically isolate the elements. The isolating film 5a is formed in contact with the buried insulating film 2 perfectly through the silicon layer in order to electrically isolate the elements completely. With such a structure, latch up free is obtained and a tolerance to noises is enhanced. For distinction from a partial isolating film which will be described below, the insulating film will be hereinafter referred to as a complete isolating film.

The MOS transistor formed on an ordinary bulk substrate in place of the SOI substrate is used by applying a body voltage (for example, a ground potential) to the bulk substrate to be a body region. However, in the case of the SOI device shown in FIG. 45, each MOS transistor TR1 is electrically insulated completely from the substrate 1 through the buried insulating film 2 and the complete isolating film 5a and the silicon layer 3a of the body region is set in an electrical floating state. For this reason, floating-body problems arise, which are negligible in the MOS transistor formed on the bulk substrate.

As one of the floating-body problems, a humup (a bump-shaped step portion) is generated in current-voltage characteristics of a drain-source current Ids and a drain-source voltage Vds, that is, a so-called kink effect is caused. FIG. 46 is a chart showing the kink effect. As shown in FIG. 46, a hump HP is generated in a portion to have a constant current characteristic in a current-voltage characteristic of an ordinary transistor.

It is supposed that the hump HP is generated due to a hole HL accumulated in the vicinity of the source region 6b shown in FIG. 47. The hole HL is generated due to the impact ionization phenomena, and is accumulated in the vicinity of the source region 6b and a pn junction between a body and a source is forward biased. If the body voltage is applied to the body region, such a problem arises with difficulty.

Moreover, it is supposed that other causes of the generation of the hump HP include a parasitic bipolar transistor PT shown in FIG. 47 in which the drain region 6a, the source region 6b and the silicon layer 3a of the body region are set to be a collector, an emitter and a base, respectively. In addition to the kink effect, the parasitic bipolar transistor PT causes a drop in a breakdown voltage between a drain and a source, abnormal sharpness of inclination of subthreshold characteristics, an increase in a current during OFF, a drop in a threshold voltage, the generation of frequency dependency in a delay time and the like. These problems can be solved if the body voltage is applied to the body region.

Recently, a reduction in current drivabilities has also been reported as another floating-body problem (Extended Abstracts of the 1999 International Conference on Solid State Devices and Materials, Tokyo, 1999, pp. 340–341).

In order to solve such a floating-body problem, an impurity concentration of a channel portion in the body region should be increased. However, a rise in the impurity concentration increases a substrate bias effect. Consequently, the current drivabilities are reduced.

In the SOI device, moreover, reliability on hot carriers is also a matter of concern. In the case of the MOS transistor, when the silicon layer of the SOI substrate by has a very small thickness, hot carriers generated in a high electric-field region in the vicinity of a drain region are also injected into a buried insulating film as well as a gate insulating film. Consequently, the device is greatly deteriorated. The problem of the hot carriers is also important for the MOS transistor formed on the bulk substrate. In the MOS transistor formed on the SOI substrate, two insulating films, that is, the gate insulating film and the buried insulating film are provided. Therefore, the problem of the hot carriers is more serious.

In order to solve the floating-body problem and the hot carrier problem described above, it is preferable that an electric potential of the body region should be fixed electrically. In the SOI device shown in FIG. 45, each MOS transistor TR1 is electrically insulated completely from the substrate 1 through the buried insulating film 2 and the complete isolating film 5a. With this structure, accordingly, a body terminal connected electrically to the body region should be provided on a surface of the SOI substrate and a body voltage should be applied thereto in order to control the body potential to the silicon layer 3a of the body region.

However, if the body terminal is provided on all the MOS transistors in an integrated circuit, a circuit area is greatly increased.

Consequently, it has been proposed that a partial isolating film which does not reach the buried insulating film is employed in place of the complete isolating film 5a. If the isolating film does not reach the buried insulating film, it is sufficient that one body terminal should be provided on the surface of the SOI substrate in a proper portion because the body regions of the MOS transistors are electrically connected to each other.

FIGS. 48 to 50 are views showing the case in which the partial isolating film is applied to the SOI device illustrated in FIG. 45. FIG. 48 is a top view showing the SOI device, FIG. 49 is a sectional view taken along the line X7—X7 in FIG. 48, and FIG. 50 is a sectional view taken along the line Y—Y in FIG. 48.

In the SOI device shown in FIGS. 49 and 50, a partial isolating film 5b is formed between the MOS transistors TR1 in place of the complete isolating film 5a of the SOI device shown in FIG. 45. The silicon layer 3b is not completely removed but remains between the partial isolating film 5b and the buried insulating film 2. As is apparent from FIG. 50, the silicon layer 3b provided under the partial isolating film 5b and the silicon layer 3a of the body region of the MOS transistor TR1 belong to the same well and are electrically connected to each other.

On the other hand, a body terminal region 3d shown in FIG. 48 also belongs to the same well as the silicon layers 3a and 3b, and is electrically connected thereto. Accordingly, a body voltage Vbd is applied to the body terminal region 3d so that the electric potentials of the silicon layers 3a and 3b are fixed to the body voltage Vbd. Consequently, the floating-body problem and the hot carrier problem can be solved.

In the SOI substrate employing the partial isolating film, an advantage such as latch up free obtained by the conventional SOI substrate employing the complete isolating film is eliminated. In the case in which an impurity is previously injected into a silicon layer to provide a plurality of wells having different conductivity types, it can also be proposed that the partial isolating film is employed only in a well of the homogeneous conductivity type and the complete isolating film is employed for a boundary region between wells of different conductivity types.

If it is not necessary to take the latch up problem and the like into consideration, only the partial isolating film can be used. Consequently, it is not necessary to manufacture the insulating films of both types. Thus, the number of steps required for the manufacture can be decreased.

However, the silicon layer 3b provided under the partial isolating film 5b has a small thickness. Consequently, a value of a resistance RS is easily increased. In particular, as the position of the MOS transistor TR1 is more distant from the body terminal region 3d, a value of a resistance therebetween is increased. Consequently, it is hard to control the body potential all over the semiconductor device.

Consequently, the floating-body problem and the hot carrier problem cannot be solved satisfactorily. Moreover, the characteristics of the semiconductor element are varied depending on a distance from the body terminal region.

As shown in FIG. 51, for example, if the drain region 6a and the source region 6b of the MOS transistor TR1 are provided in no contact with the buried insulating film 2, the silicon layer 3b is conducted to the silicon layer 3a of the body region under the drain region 6a and the source region 6b. Consequently, the floating-body problem and the hot carrier problem can be somewhat solved. However, the above-mentioned problems cannot be solved satisfactorily.

In the partial isolating film 5b which is widely distributed, a great tensile stress is applied to the drain region 6a and the source region 6b which are adjacent to the silicon layer 3b provided under the partial isolating film 5b and the partial isolating film 5b. In FIG. 49, the tensile stress is indicated as ST2. The tensile stress ST2 is caused by a change in a volume of the partial isolating film 5b due to heat during the formation of the partial isolating film 5b and a difference in a coefficient of thermal expansion between the silicon layer 3b and the partial isolating film 5b. In the partial isolating film 5b which is widely distributed, the volume is greatly changed. Consequently, peripheral structures are greatly influenced.

If the tensile stress ST2 is great, a crystal defect is generated on the silicon layer 3b, the drain region 6a and the source region 6b. As a result, there is a possibility that a leakage current in a well might be increased. In particular, since the silicon layer 3b has a small thickness, the crystal defect is easily generated.

Also in the case in which the partial isolating film and the complete isolating film are used together, the floating-body problem, the hot carrier problem and the crystal defect problem may arise.

SUMMARY OF THE INVENTION

It is an object of the present invention to satisfactorily solve a floating-body problem and a hot carrier problem which often arise in an SOI device and to provide a semiconductor device in which a widely distributed partial isolating film generates a crystal defect for peripheral structures with difficulty and a method of manufacturing the semiconductor device.

A first aspect of the present invention is directed to a semiconductor device comprising an SOI substrate having a substrate, a buried insulating film formed on the substrate, and a semiconductor layer formed on the buried insulating film, a partial isolating film to be an insulating film formed in the vicinity of a surface of the semiconductor layer in no contact with the buried insulating film, a semiconductor element formed including a part of the semiconductor layer, and a dummy region having no function as an element which interposes the partial isolating film with the semiconductor element and is formed including another part of the semiconductor layer.

A second aspect of the present invention is directed to the semiconductor device according to the first aspect of the present invention, further comprising a complete isolating film to be an insulating film formed in contact with the buried insulating film through the semiconductor layer, and a dummy region having no function as an element which interposes the complete isolating film with the semiconductor element and is formed including another part of the semiconductor layer.

A third aspect of the present invention is directed to the semiconductor device according to the first or second aspect of the present invention, wherein an impurity of a predetermined conductivity type is injected into the semiconductor layer of the dummy region.

A fourth aspect of the present invention is directed to the semiconductor device according to the third aspect of the present invention, wherein a well of the predetermined conductivity type is formed in the semiconductor layer, and the semiconductor layer of the dummy region is a part of the well.

A fifth aspect of the present invention is directed to the semiconductor device according to any of the first to fourth aspects of the present invention, wherein a dummy wiring is connected to a surface of the semiconductor layer of the dummy region.

A sixth aspect of the present invention is directed to the semiconductor device according to the third aspect of the present invention, wherein the dummy region includes a dummy gate having a dummy gate insulating film formed on a surface of the another part of the semiconductor layer and a dummy gate electrode formed on the dummy gate insulating film.

A seventh aspect of the present invention is directed to the semiconductor device according to the sixth aspect of the present invention, wherein a fixed voltage is applied to the dummy gate electrode.

An eighth aspect of the present invention is directed to the semiconductor device according to the sixth aspect of the present invention, wherein the dummy gate is partially provided on the another part of the semiconductor layer, and an impurity of the predetermined conductivity type is injected into a portion of the another part of the semiconductor layer which is not covered with the dummy gate.

A ninth aspect of the present invention is directed to the semiconductor device according to the eighth aspect of the present invention, further comprising a dummy contact plug electrically connected to the semiconductor layer and the dummy gate electrode in the dummy region, and a dummy wiring connected to the dummy contact plug.

A tenth aspect of the present invention is directed to the semiconductor device according to the sixth aspect of the present invention, wherein the dummy gate has a cross shape, and the semiconductor layer of the dummy region constitutes a parallelogram having four sides parallel with each side forming the cross shape of the dummy gate.

An eleventh aspect of the present invention is directed to a method of arranging a dummy region comprising the steps of (a) preparing a first pattern in which a plurality of dummy regions are regularly arranged, (b) preparing a second pattern in which each of a pattern of an element and a circuit or a pattern of a well is described, and (c) superposing the first and second patterns to erase the dummy region in a portion superposed on the element and the circuit or a boundary portion of the well, thereby determining an arrangement of the dummy regions.

A twelfth aspect of the present invention is directed to the method of arranging a dummy region according to the eleventh aspect of the present invention, wherein the arrangement of the dummy region is determined by erasing the dummy region present around the pattern in addition to the dummy region in a portion superposed on the pattern at the step (c).

A thirteenth aspect of the present invention is directed to the method of arranging a dummy region according to the twelfth aspect of the present invention, wherein another dummy region having a different size from a size of the dummy region is newly provided in a position where the dummy region is erased such that it is not superposed on the pattern at the step (c).

A fourteenth aspect of the present invention is directed to a method of manufacturing a semiconductor device comprising the steps of (a) preparing an SOI substrate having a substrate, a buried insulating film formed on the substrate, and a semiconductor layer formed on the buried insulating film, (b) forming a partial isolating film to be an insulating film in no contact with the buried insulating film in the vicinity of a surface of the semiconductor layer, (c) forming a semiconductor element in the semiconductor layer, and (d) forming a dummy region having no function as an element in the semiconductor layer while interposing the partial isolating film with the semiconductor element simultaneously with the step (c).

According to the first aspect of the present invention, the dummy region is provided. Therefore, a floating-body problem and a hot carrier problem can be solved more satisfactorily than the case in which the partial isolating film is continuously provided. Furthermore, a tensile stress of the partial isolating film can be distributed over the dummy region and force applied to the semiconductor element or the like through the tensile stress can be reduced. Moreover, the provision of the dummy region can enhance the stability of a forming process for the partial isolating film.

According to the second aspect of the present invention, the dummy region is provided. Therefore, a tensile stress of the complete isolating film can be distributed over the dummy region and force applied to the semiconductor element or the like through the tensile stress can be reduced. Moreover, the provision of the dummy region can enhance the stability of a forming process for the complete isolating film. Furthermore, the complete isolating film is provided. Therefore, a tolerance to latch up and noises is great.

According to the third aspect of the present invention, the impurity of the predetermined conductivity type is injected into the semiconductor layer of the dummy region. Therefore, a value of a resistance between the semiconductor element and a portion to which a body voltage is applied can be prevented from being increased. Accordingly, the body potential can be controlled all over the semiconductor device, and the floating-body problem and the hot carrier problem can be solved. Consequently, it is possible to prevent the characteristics of the semiconductor element from being varied depending on a distance from a body terminal region.

According to the fourth aspect of the present invention, a resistance value of the dummy region can be more reduced than that in the case in which the well and the semiconductor layer of the dummy region have conductivity types different from each other.

According to the fifth aspect of the present invention, the dummy wiring is connected to the surface of the semiconductor layer of the dummy region. Therefore, the body potential can be controlled more easily all over the semiconductor device and the floating-body problem and the hot carrier problem can be solved more reliably. Moreover, in the case in which an interlayer insulating film is provided between the dummy wirings and an upper interlayer insulating film is further formed thereon and is subjected to a CMP method, dishing is caused on the upper interlayer insulating film with difficulty. Furthermore, it is possible to eliminate a self-heating effect which often makes troubles in an SOI device.

According to the sixth aspect of the present invention, the dummy gate electrode is provided. Therefore, in the case in which the semiconductor element having a gate electrode is to be formed by photolithography or the like, it is possible to prevent a variation in a dimension of the gate electrode from being generated. Furthermore, in the case in which the interlayer insulating film is formed in upper portions of the semiconductor element and the dummy region and is subjected to the CMP method, the dishing is caused on the interlayer insulating film with difficulty.

According to the seventh aspect of the present invention, a dummy gate voltage is applied to the dummy gate electrode. Therefore, the resistance value of the semiconductor layer can be more reduced.

According to the eighth aspect of the present invention, the dummy gate is partially provided on another part of the semiconductor layer and the impurity of the predetermined conductivity type is injected into the portion of another part of the semiconductor layer which is not covered with the dummy gate. Therefore, the effects of the semiconductor devices according to the third and sixth aspects of the present invention can be obtained at the same time.

According to the ninth aspect of the present invention, the semiconductor layer of the dummy region and the dummy gate electrode can be connected electrically. Therefore, the resistance value of the dummy region can be fixed. Moreover, the electrical connection is carried out by using the dummy contact plug and the dummy wiring. Therefore, the body potential can be controlled more easily all over the semiconductor device and the floating-body problem and the hot carrier problem can be solved more reliably. Moreover, in the case in which an interlayer insulating film is provided between the dummy wirings and an upper interlayer insulating film is further formed on the interlayer insulating film and is subjected to a CMP method, dishing is caused on the upper interlayer insulating film with difficulty because the dummy wiring is provided. Furthermore, it is possible to eliminate a self-heating effect which often makes troubles in the SOI device.

According to the tenth aspect of the present invention, the dummy gate has the cross shape, and the semiconductor layer of the dummy region constitutes a parallelogram having four sides parallel with each side forming the cross shape of the dummy gate. Therefore, also in the case in which the pattern of the dummy gate is shifted, the resistance value of the dummy region is not changed. Thus, the dummy region can have a resistance value which is rarely influenced by the stability of the process.

According to the eleventh aspect of the present invention, the dummy region in the portion superposed on the element and the circuit or the boundary portion of the well is erased. Consequently, the element and the circuit or the well can be prevented from being short-circuited through the dummy region.

According to the twelfth aspect of the present invention, not only the dummy region in the portion superposed on the patterns of the element and the circuit or the boundary portion of the well but also the dummy region existing therearound is erased. Therefore, the element and the circuit or the well can be more prevented from being short-circuited through the dummy region.

According to the thirteenth aspect of the present invention, another dummy region having a different size from the size of the dummy region is newly provided in the position where the dummy region is erased such that it is not superposed on the pattern. Therefore, the isolating film can have a uniform density and the dummy region is effective in the stability of the process such as a CMP.

According to the fourteenth aspect of the present invention, the semiconductor element and the dummy region are formed at the same time. Therefore, a new step of providing the dummy region is not required and a layout of a conventional photomask is only changed, which is economical.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a view showing an electric resistance applied between A and B points interposing a dummy region in the SOI device according to the eighth embodiment;

FIG. 15 is a view showing an electric resistance applied between C and D points interposing a dummy region in the SOI device according to the seventh embodiment;

FIG. 16 is a top view showing an SOI device according to a ninth embodiment;

FIGS. 18 to 22 are views showing a method of arranging a dummy region according to a tenth embodiment;

DESCRIPTION OF THE PREFERRED EMBODIMENTS

<First Embodiment>

Figure 1:
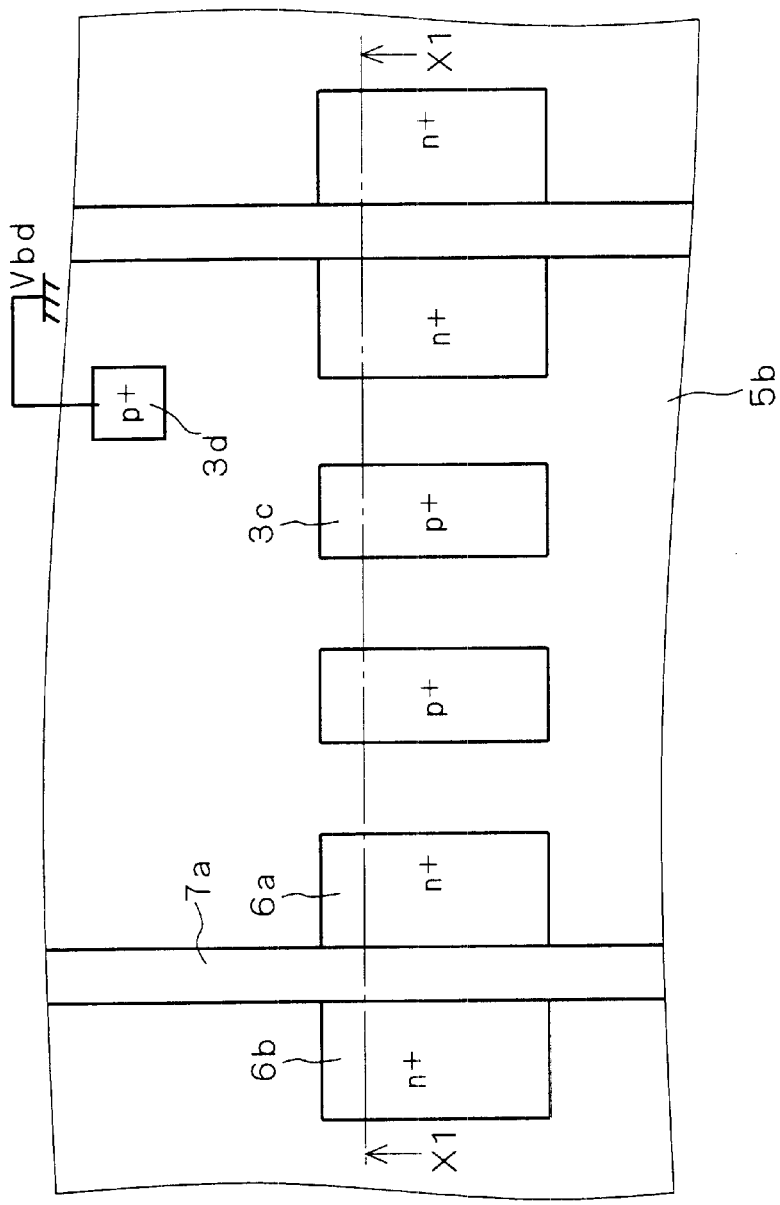
FIG. 1 is a top view showing an SOI device according to a first embodiment.
Figure 2:
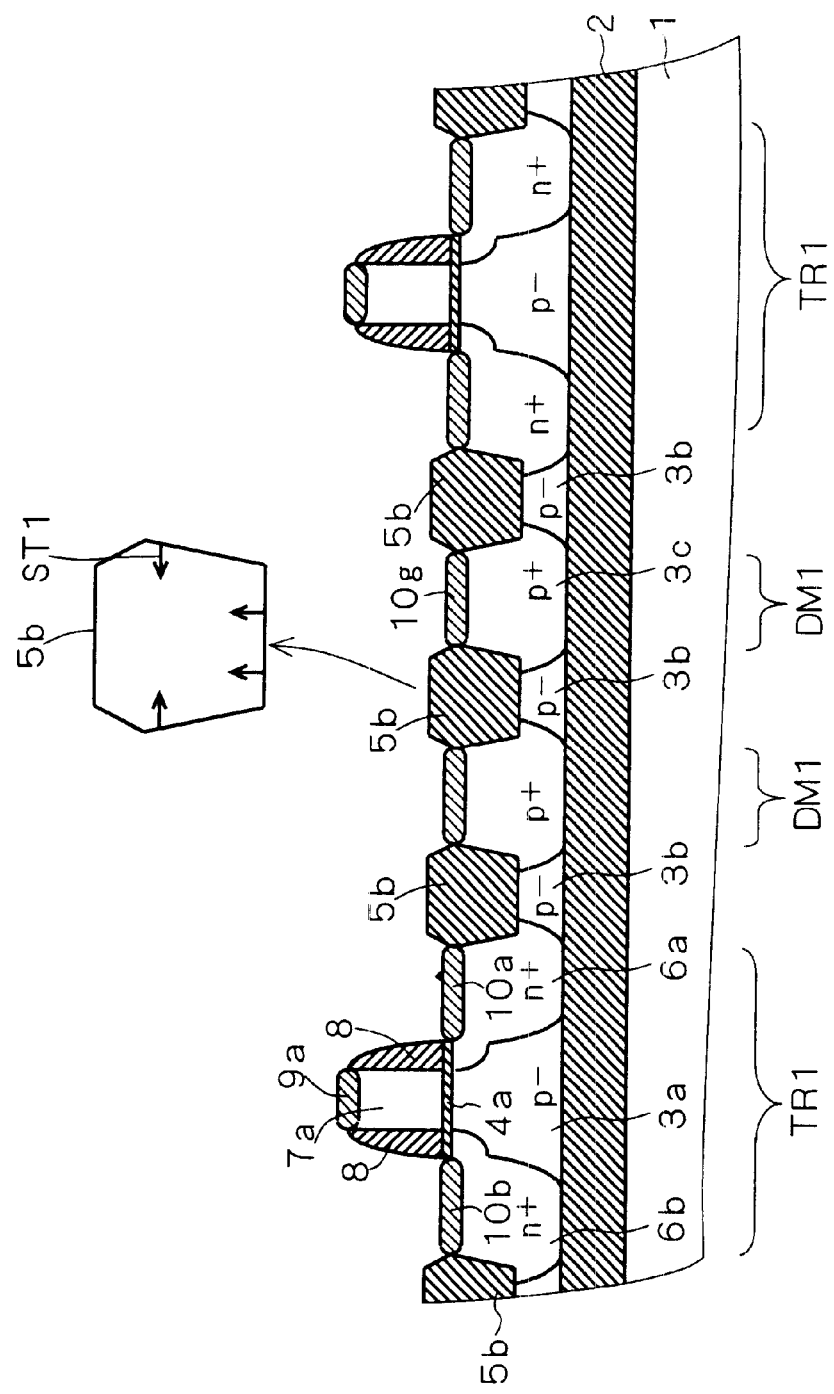
FIG. 2 is a sectional view showing the SOI device according to the first embodiment.

FIGS. 1 and 2 are views showing an SOI device according to a first embodiment of the present invention. FIG. 1 is a top view showing the SOI device, and FIG. 2 is a sectional view taken along the line X1—X1 in FIG. 1. In FIGS. 1 and 2, elements having the same functions as those of the SOI device shown in FIGS. 48 to 50 have the same reference numerals.

As shown in FIGS. 1 and 2, the SOI device has an SOI substrate constituted by a substrate 1, a buried insulating film 2 and a silicon layer in the same manner as a conventional SOI device. Silicon layers 3a and 3b indicate a part of a silicon layer constituting the SOI substrate. A plurality of MOS transistors TR1 are formed in the vicinity of a surface of the silicon layer 3a as an example of a semiconductor element. By way of example, the MOS transistor TR1 is an n-channel type. Moreover, both the silicon layers 3a and 3b belong to a well formed by injection of a p-type impurity, for example. Furthermore, a body terminal region 3d belonging to the same well as the silicon layers 3a and 3b is also provided in the same manner as in FIG. 48. A body voltage Vbd is applied to the body terminal region 3d and electric potentials of the silicon layers 3a and 3b are fixed to the body voltage Vbd.

Figure 48:
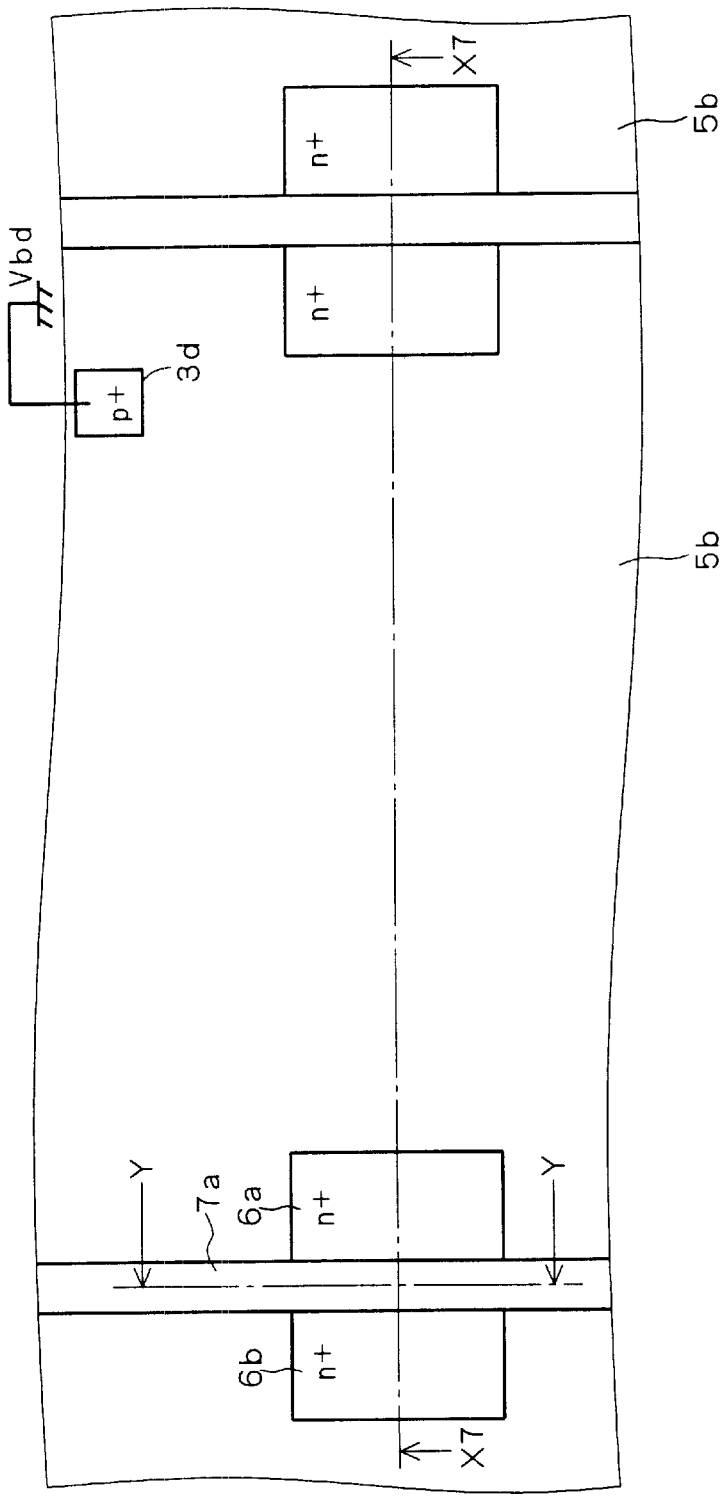
FIG. 48 is a top view showing the conventional SOI device.
Figure 49:
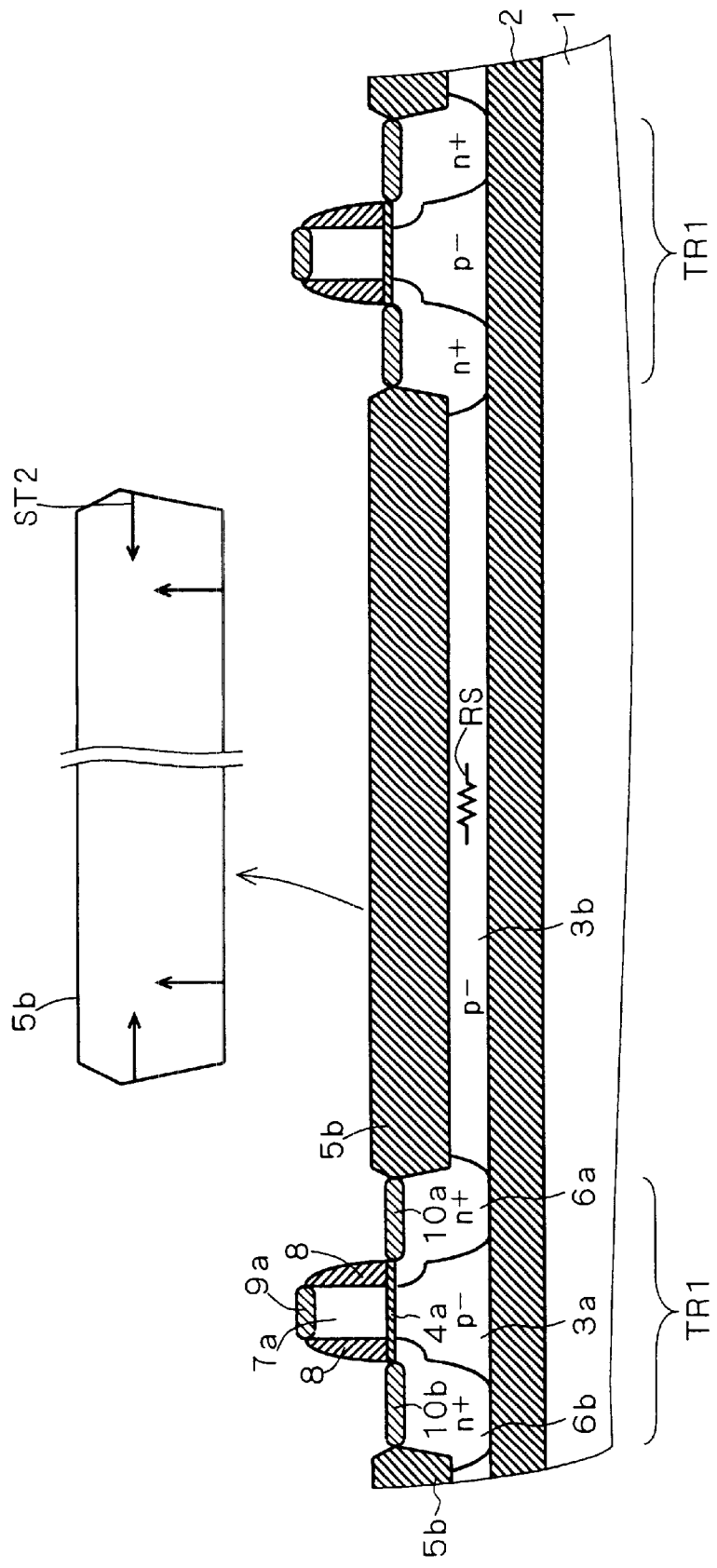
FIGS. 49 to 51 are sectional views showing the conventional SOI device.
Figure 50:
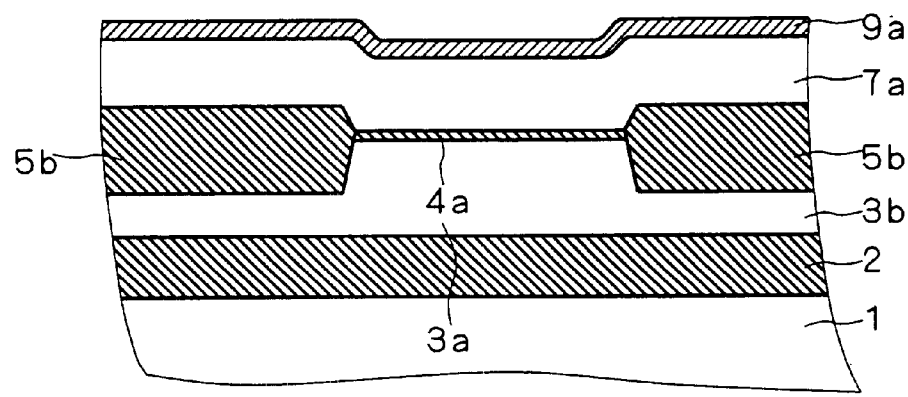

The MOS transistor TR1 includes a drain region 6a and a source region 6b which are formed in the silicon layer 3a and a gate insulating film 4a and a gate electrode 7a which are formed on a surface of the silicon layer 3a in the same manner as the SOI device shown in FIGS. 48 to 50. The silicon layer 3a interposed between the drain region 6a and the source region 6b functions as a body region of the MOS transistor TR1. In FIG. 2, silicide regions 9a, 10a and 10b are formed on surfaces of the gate electrode 7a, the drain region 6a and the source region 6b in order to reduce a resistance. Moreover, a side wall 8 used for forming an extension region in the drain region 6a and the source region 6b is formed on a side surface of the gate electrode 7a. As an example, FIG. 2 shows the case in which the drain region 6a and the source region 6b are provided deeply in contact with the buried insulating film 2.

Also in the SOI device according to the present embodiment, a partial isolating film 5b formed of an insulating film such as an oxide film is provided between the MOS transistors TR1. Moreover, the silicon layer 3b is not completely removed but remains between the partial isolating film 5b and the buried insulating film 2. In the same manner as in FIG. 50, the silicon layer 3b provided under the partial isolating film 5b and the silicon layer 3a of the body region of the MOS transistor TR1 belong to the same well and are electrically connected to each other.

In the present embodiment, the partial isolating film 5b is not provided continuously between the MOS transistors TR1 differently from the SOI device shown in FIGS. 48 to 50. As shown in FIGS. 1 and 2, a dummy region DM1 which does not have the function as an element is formed at almost regular intervals in the partial isolating film 5b between the MOS transistors TR1.

The dummy region DM1 has a dummy active region 3c formed by further injecting an impurity into a well formed on a silicon layer, and a silicide region 10g is further formed on a surface of the dummy active region 3c. Thus, since the dummy region DM1 is formed in the partial isolating film 5b, the occupation rate of the silicon layer 3b provided under the partial isolating film 5b in a semiconductor device is decreased. With the decrease in the silicon layer 3b, the occupation rate of the dummy active region 3c and the silicide region 10g is increased. The silicide region 10g is formed to reduce a body resistance of the dummy region DM1.

It is preferable that the conductivity type of the impurity to be injected into the dummy active region 3c should be the same as that of a well formed on the silicon layer. The reason is that a resistance value of the dummy region can be more reduced than that in the case of the injection of an impurity having a different conductivity type.

For example, since the silicon layers 3a and 3b are formed as p-type wells in FIG. 2, a p-type impurity such as B, $BF_2$ or the like may be injected into the dummy active region 3c. At this time, an impurity concentration of the dummy active region 3c is set to be higher than impurity concentrations of the silicon layers 3a and 3b. To the contrary, if the silicon layers 3a and 3b are formed to be n-type wells, an n-type impurity such as As, P, Sb or the like is preferably injected into the dummy active region 3c.

The dummy active region 3c and the silicide region 10g have lower resistance values than a resistance value of the silicon layer 3b. Therefore, it is possible to prevent an increase in a value of a resistance between the MOS transistor TR1 and the body terminal region 3d, for example, the resistance RS. Accordingly, the body potential can be controlled all over the semiconductor device, and a floating-body problem and a hot carrier problem can be solved. Furthermore, it is possible to prevent the characteristics of the semiconductor element from being varied depending on a distance from the body terminal region.

When the dummy active region 3c is provided as described above, the resistance value of the dummy region DM1 can be reduced. However, the well formed on the silicon layer may be used as a dummy active region without further injection of an impurity. In that case, the well is used for the dummy active region without further injection. Therefore, the impurity concentration of the well is not as high as that of the dummy active region 3c. For this reason, a resistance value is more increased than that in the dummy active region 3c. However, the resistance value of the silicon layer extended over a whole thickness is lower than that of the silicon layer 3b provided under the partial isolating film 5b. Accordingly, the well can be utilized as the dummy active region.

In the partial isolating film 5b of the SOI device according to the present embodiment, the dummy region DM1 is provided. Therefore, a tensile stress of the partial isolating film 5b can be distributed over the dummy region. Consequently, it is possible to reduce force applied to a semiconductor element and the like through the tensile stress. In FIG. 2, the tensile stress is indicated as ST1. The tensile stress ST1 is smaller than the tensile stress ST2 shown in FIG. 49 and less influences the MOS transistor TR1 and the silicon layer 3b. Accordingly, a crystal defect is generated with difficulty on the silicon layer 3b, the drain region 6a and the source region 6b, and a leakage current is increased in the well with difficulty.

The provision of the dummy region DM1 can enhance the stability of a forming process for the partial isolating film 5b. More specifically, in the case in which the partial isolating film 5b is formed by using a CMP (Chemical Mechanical Polishing) method, a pressure applied to the wafer can easily be made constant and dishing is caused on the partial isolating film 5b with difficulty. Moreover, in the case in which the partial isolating film 5b is formed by plasma etching, the state of a plasma can be uniformly maintained on the wafer because the partial isolating film 5b is distributed properly.

By using the SOI device according to the present embodiment, the floating-body problem and the hot carrier problem can be solved because the dummy region DM1 is formed. Consequently, it is possible to prevent the characteristics of the semiconductor element from being varied depending on the distance from the body terminal region. Furthermore, the tensile stress of the partial isolating film 5b can be distributed over the dummy region, and the force applied to the semiconductor element and the like through the tensile stress can be reduced. Accordingly, a crystal defect is generated with difficulty on the silicon layer 3b, the drain region 6a and the source region 6b, and a leakage current is increased in the well with difficulty. Moreover, the provision of the dummy region DM1 can enhance the stability of the forming process for the partial isolating film 5b.

Figure 51:
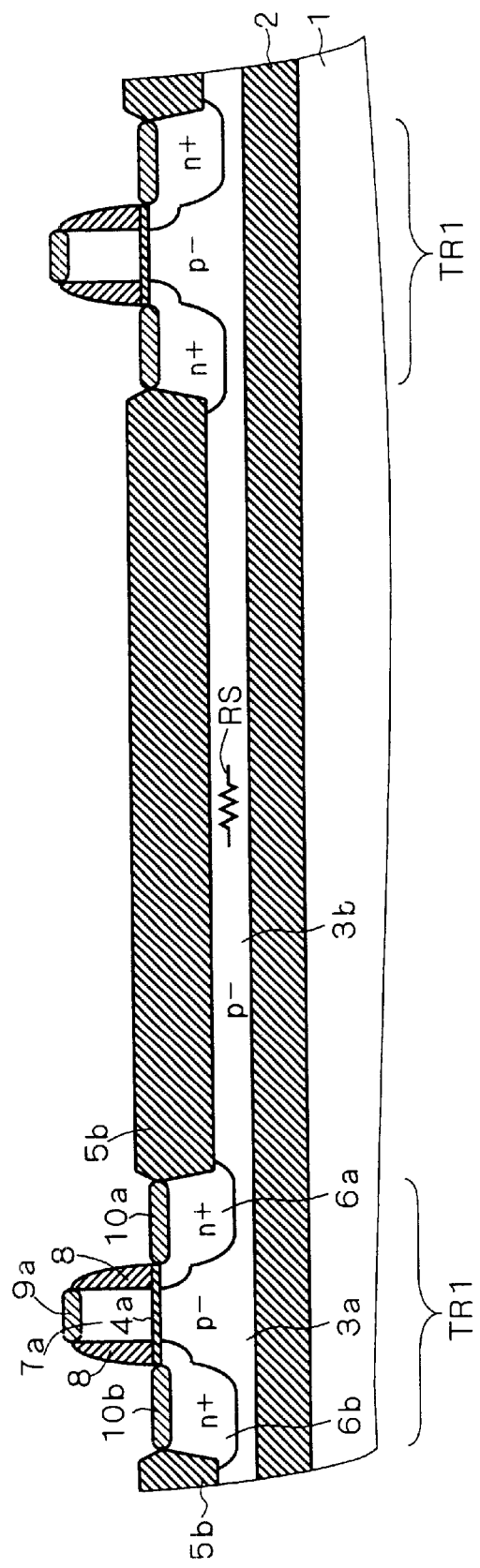

As in the SOI device shown in FIG. 51, the drain region 6a and the source region 6b of the MOS transistor TR1 may be provided in no contact with the buried insulating film 2 in the SOI device according to the present embodiment. Consequently, it is possible to solve the floating-body problem and the hot carrier problem more satisfactorily.

While the case in which the silicide region 10g is formed has been described in the present embodiment, the above-mentioned effects can be obtained even if the silicide region 10g is not formed. Usually, silicidation is not carried out in a source region and a drain region in order to improve refresh characteristics in a memory cell of a DRAM and the like. In that case, the silicide region is not provided in the dummy region of the SOI device according to the present embodiment. If the dummy region DM1 is provided with such a structure that the silicide region is not provided, it is possible to more reduce a body resistance than that in the conventional art having only the thin silicon layer 3b provided under the partial isolating film 5b.

<Second Embodiment>

Figure 3:
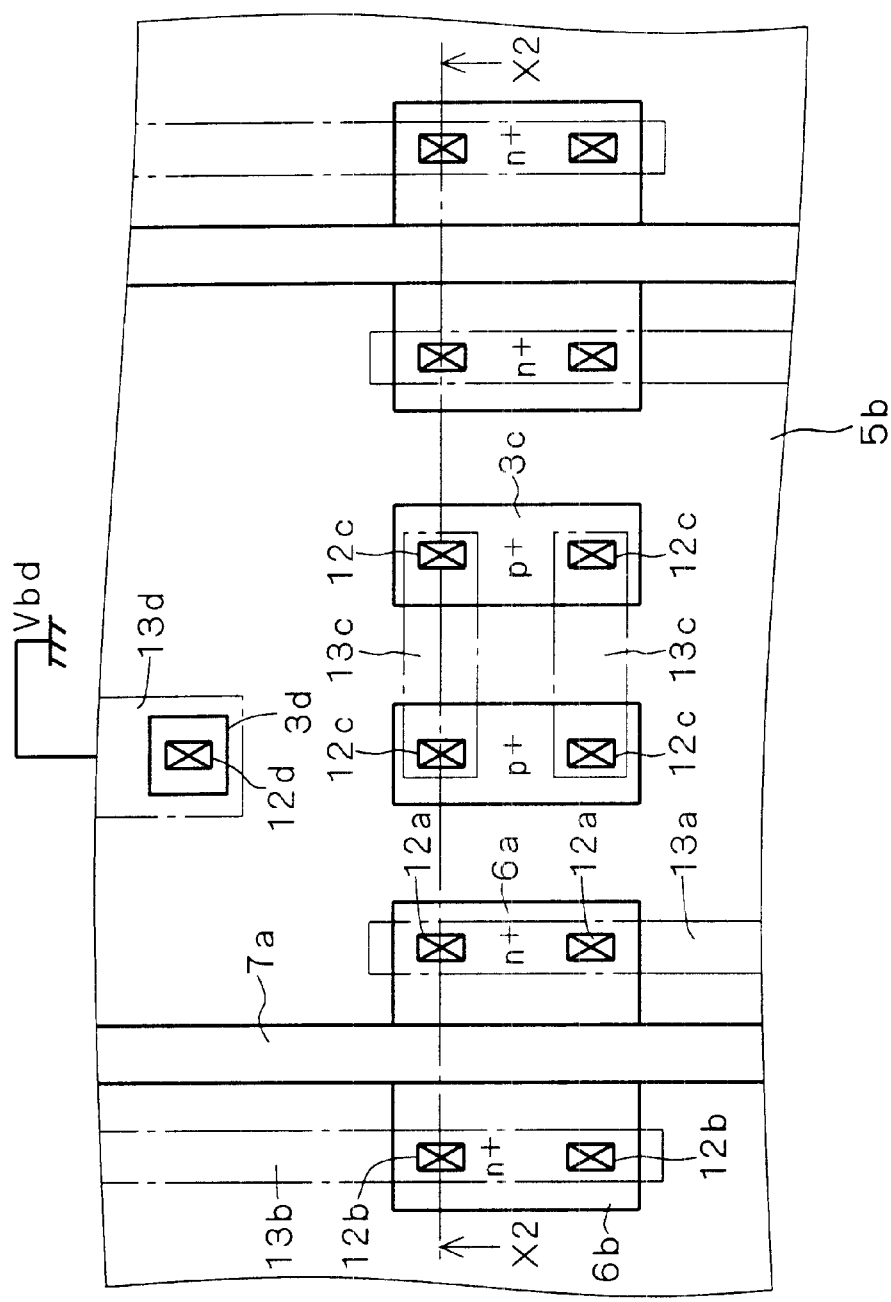
FIG. 3 is a top view showing an SOI device according to a second embodiment.
Figure 4:
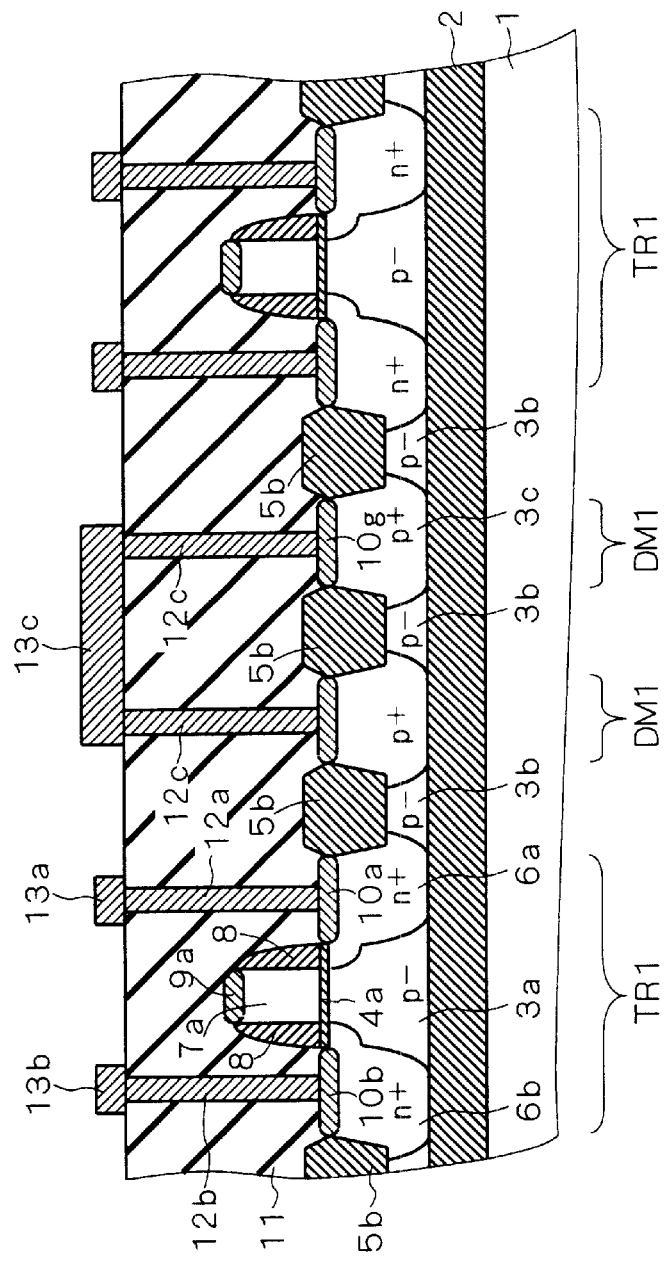
FIG. 4 is a sectional view showing the SOI device according to the second embodiment.

In the present embodiment, description will be given to a variant of the SOI device according to the first embodiment. FIG. 3 is a top view showing an SOI device according to the present embodiment, and FIG. 4 is a sectional view taken along the line X2—X2 in FIG. 3. In FIGS. 3 and 4, elements having the same functions as those of the SOI device according to the first embodiment have the same reference numerals.

In the present embodiment, a dummy contact plug 12c and a dummy wiring 13c which are formed of a metal such as Al or a conductive material such as polysilicon are provided in order to further reduce a resistance value of a dummy region DM1.

In many cases, contact plugs 12a and 12b formed in an interlayer insulating film 11 are connected through silicide regions 10a and 10b to a drain region 6a and a source region 6b of an MOS transistor TR1 respectively as shown in FIG. 4, and wirings 13a and 13b are connected to the contact plugs 12a and 12b respectively. In the present embodiment, the same dummy contact plug 12c as the contact plugs 12a and 12b is also connected to a dummy active region 3c of the dummy region DM1 through a silicide region 10g, and the same dummy wiring 13c as the wirings 13a and 13b is provided on a dummy contact plug 12c.

It is preferable that the dummy wiring 13c should be connected across the adjacent dummy regions DM1. Consequently, an electrical path is formed by not only the dummy active region 3c and a silicon layer 3b but also the dummy wiring 13c between the adjacent dummy regions DM1. Thus, the resistance value of the dummy region DM1 can be reduced still more. Accordingly, a body potential can be controlled more easily all over a semiconductor device, and a floating-body problem and a hot carrier problem can be solved more reliably.

By the provision of the dummy wiring 13c, a variation in a height caused by the presence or absence of a wiring on the interlayer insulating film 11 can be suppressed. Consequently, in the case in which an interlayer insulating film (not shown) to be an upper layer is formed on the interlayer insulating film 11 and is subjected to a CMP method, a pressure applied to the upper interlayer insulating film can easily be made constant so that dishing is generated on the upper interlayer insulating film with difficulty.

By the provision of the dummy wiring 13c, furthermore, it is possible to suppress a self-heating effect which often makes troubles in the SOI device. The self-heating effect implies a phenomenon in which heat generated during the operation of an element cannot fully be radiated but is accumulated. In the SOI device, a semiconductor element is enclosed with a buried insulating film and an isolating film which are formed of oxide films or the like having comparatively small thermal conductivities. Consequently, the self-heating effect often makes troubles. However, the dummy wiring 13c can contribute to heat radiation, thereby suppressing the self-heating effect if any.

As shown in FIG. 3, a contact plug 12d and a wiring 13d are also provided in a body terminal region 3d. The wiring 13d is electrically connected to a body voltage Vbd.

Since other structures are the same as the structure of the SOI device according to the first embodiment, their description will be omitted.

By using the SOI device according to the present embodiment, since the dummy contact plug 12c and the dummy wiring 13c are formed, the body potential can be controlled more easily all over the semiconductor device so that the floating-body problem and the hot carrier problem can be solved more reliably. Moreover, in the case in which the upper interlayer insulating film is further formed on the interlayer insulating film 11 and is subjected to the CMP method, the dishing is generated on the upper interlayer insulating film with difficulty. Furthermore, it is possible to suppress the self-heating effect which often makes troubles in the SOI device.

<Third Embodiment>

Figure 5:
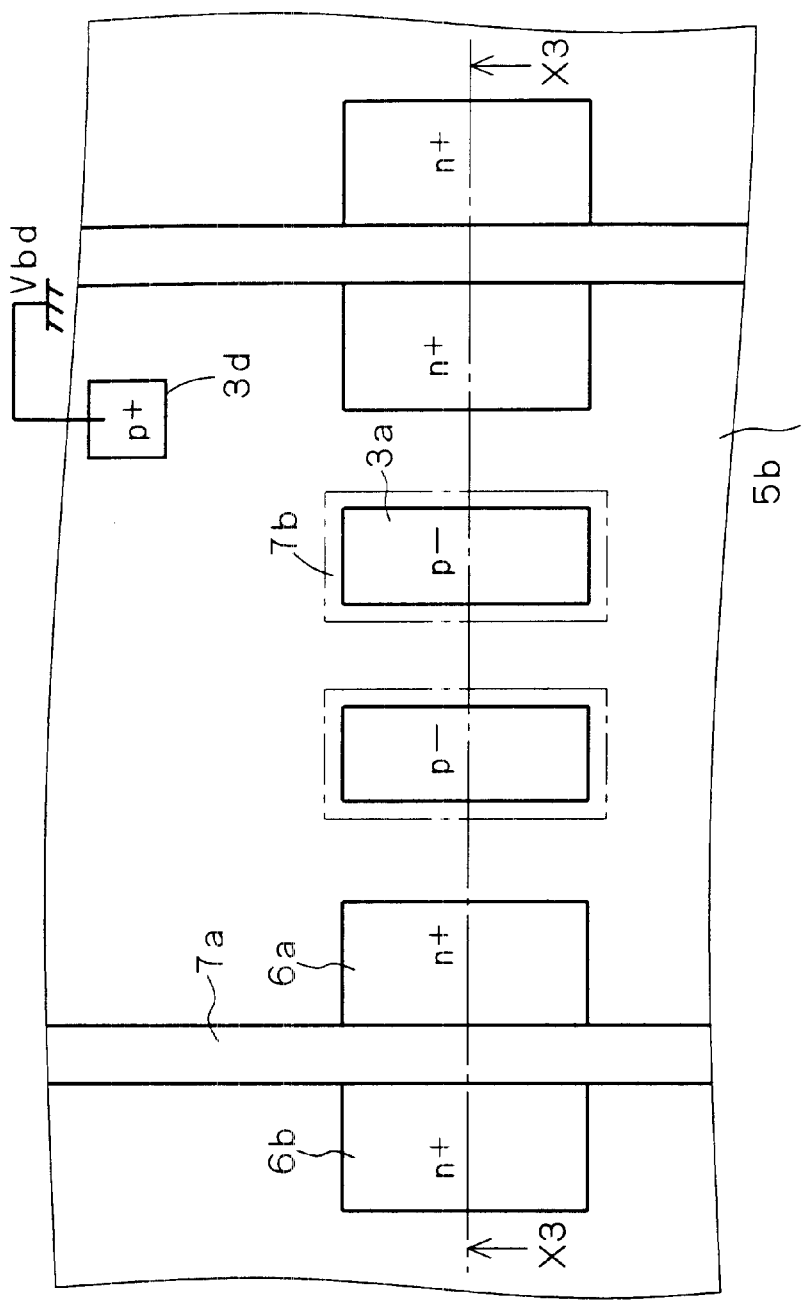
FIG. 5 is a top view showing an SOI device according to a third embodiment.
Figure 6:
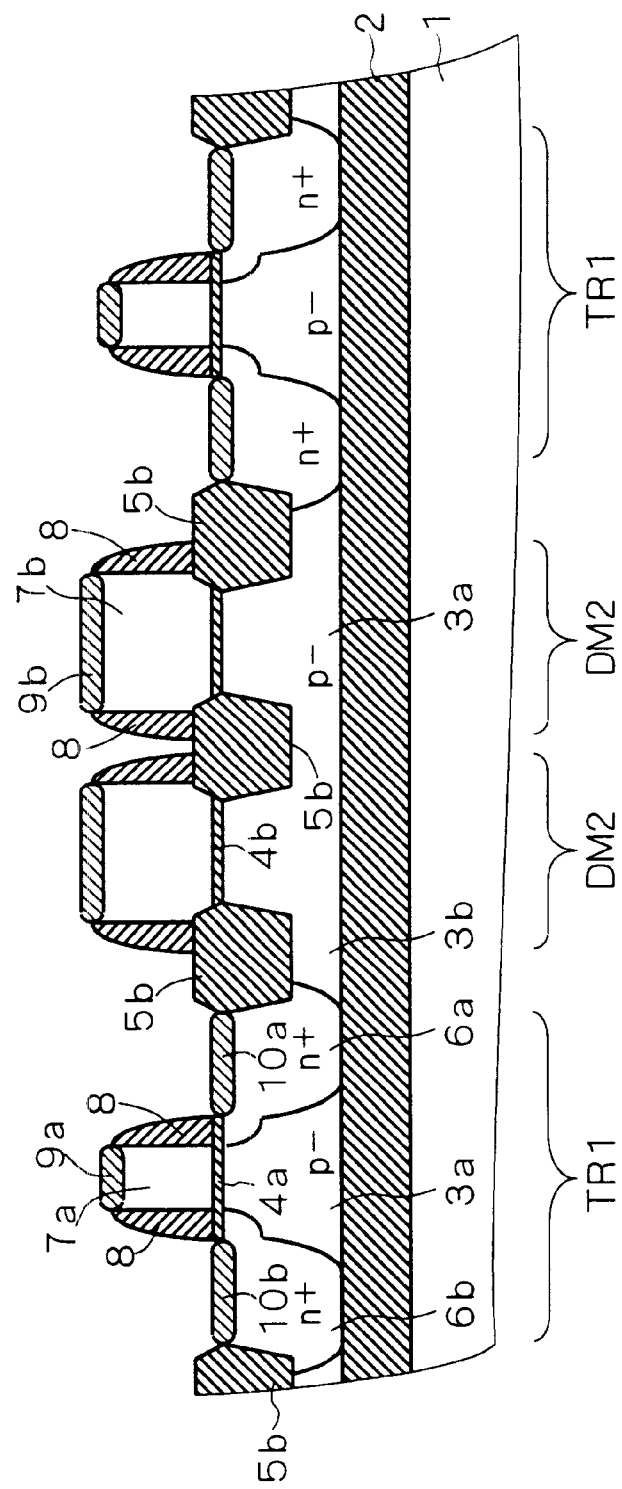
FIG. 6 is a sectional view showing the SOI device according to the third embodiment.

In the present embodiment, description will be given to a variant of the SOI device according to the first embodiment. FIG. 5 is a top view showing an SOI device according to the present embodiment, and FIG. 6 is a sectional view taken along the line X3—X3 in FIG. 5. In FIGS. 5 and 6, elements having the same functions as those of the SOI device according to the first embodiment have the same reference numerals.

In the present embodiment, a dummy region DM2 having a dummy gate insulating film 4b and a dummy gate electrode 7b is formed in place of the dummy region DM1. The dummy region DM2 is provided with, as a dummy active region, a well formed on a silicon layer 3a, and furthermore, has the dummy gate insulating film 4b which is formed on the silicon layer 3a and is made of an insulating film such as an oxide film, and the dummy gate electrode 7b formed on the dummy gate insulating film 4b. Moreover, a silicide region 9b is formed on a surface of the dummy gate electrode 7b. Furthermore, a side wall 8 is formed on a side surface of the dummy gate electrode 7b.

Thus, the dummy region DM2 is formed in a partial isolating film 5b. Consequently, the occupation rate of a silicon layer 3b provided under the partial isolating film 5b in a semiconductor device is decreased. The occupation rate of the silicon layer 3a to be the dummy active region is increased by the decrease in the silicon layer 3b.

The silicon layer 3a has a lower resistance value than that of the silicon layer 3b corresponding to a great thickness. Therefore, it is possible to prevent an increase in a value of a resistance between an MOS transistor TR1 and a body terminal region 3d, for example, the resistance RS. Accordingly, the body potential can be controlled all over the semiconductor device, and a floating-body problem and a hot carrier problem can be solved. Furthermore, it is possible to prevent the characteristics of the semiconductor element from being varied depending on a distance from the body terminal region.

Since an intact well is used as the silicon layer 3a to be the dummy active region, an impurity concentration is not as high as that in the dummy active region 3c according to the first embodiment. However, the resistance value of the silicon layer extended over a whole thickness is lower than that of the silicon layer 3b provided under the partial isolating film 5b. Accordingly, the well can be utilized as the dummy active region.

Of course, the dummy active region 3c according to the first embodiment may be provided on the SOI device shown in FIG. 6 to further reduce the resistance value.

By the provision of the dummy gate electrode 7b, it is possible to prevent a dimension of the gate electrode from being varied when forming a gate electrode 7a of the MOS transistor TR1 through photolithography or the like. If a density of the gate electrode is not constant in a wafer surface, the amount of deposition of a conductive film, an etching amount and the like are varied finely. Therefore, a variation in the dimension of the gate electrode may easily be generated. However, if the dummy gate electrode 7b is provided almost uniformly in a portion in which a semiconductor element is not formed, the variation is caused with difficulty.

By the provision of the dummy gate electrode 7b, furthermore, it is also possible to suppress a variation in a height caused by the presence or absence of the gate electrode in the wafer surface. Accordingly, in the case in which an interlayer insulating film (not shown) is formed in upper portions of the MOS transistor TR1 and the dummy region DM2 and is subjected to a CMP method, a pressure applied to the interlayer insulating film can easily be made constant and dishing is caused on the interlayer insulating film with difficulty.

Since other structures are the same as the structure of the SOI device according to the first embodiment, their description will be omitted.

By using the SOI device according to the present embodiment, the dummy region DM2 is formed in the partial isolating film 5b. Therefore, the same effects as those of the SOI device according to the first embodiment can be obtained. Moreover, since the dummy gate electrode 7b is provided, it is possible to prevent the dimension of the gate electrode from being varied when forming the gate electrode 7a of the MOS transistor TR1 by using the photolithography or the like. Furthermore, in the case in which the interlayer insulating film is formed in upper portions of the MOS transistor TR1 and the dummy region DM2 and is subjected to the CMP method, the dishing is caused on the interlayer insulating film with difficulty.

<Fourth Embodiment>

In the present embodiment, description will be given to a variant of the SOI device according to the third embodiment.

Figure 7:
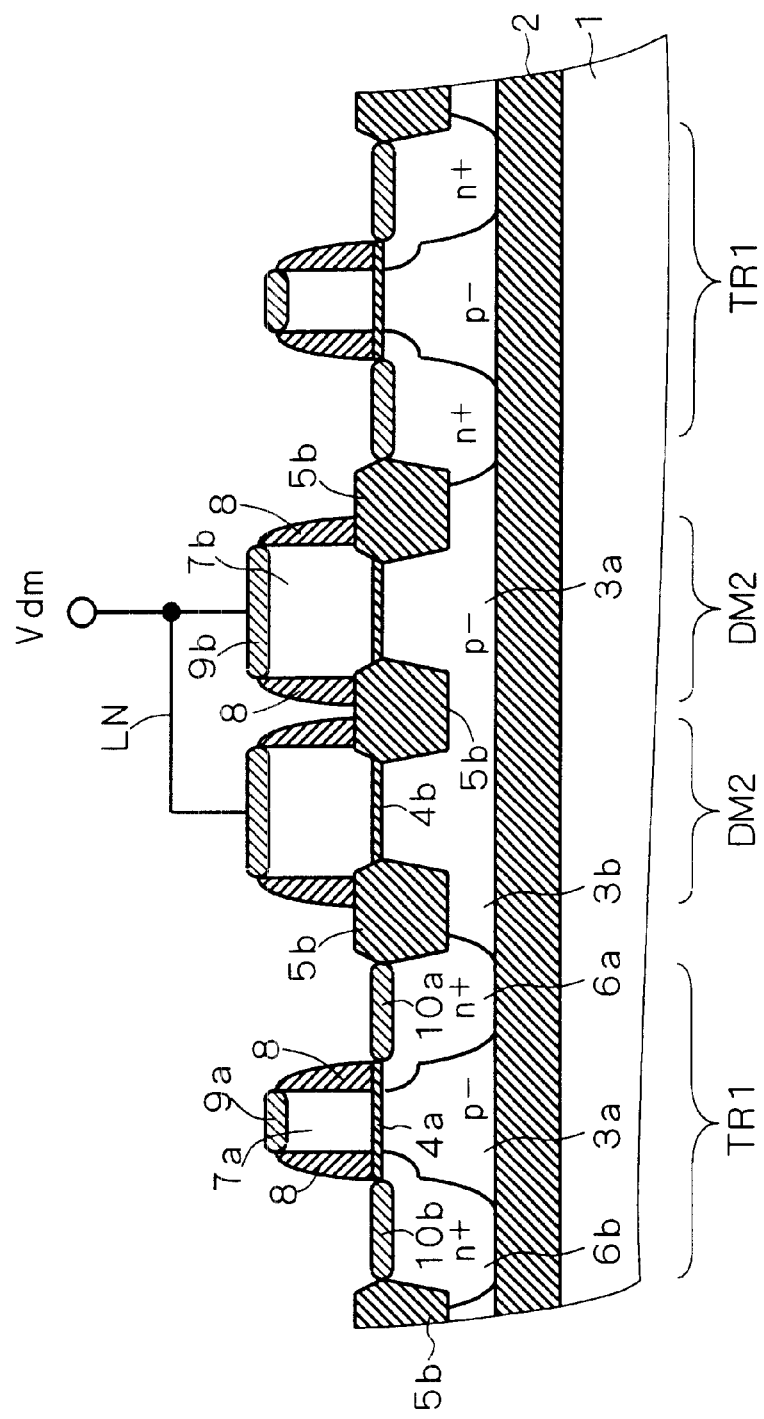
FIG. 7 is a sectional view showing an SOI device according to a fourth embodiment.

FIG. 7 is a sectional view showing an SOI device according to the present embodiment. In FIG. 7, elements having the same functions as those of the SOI device according to the third embodiment have the same reference numerals.

In the present embodiment, a wiring LN is formed on a dummy gate electrode 7b of a dummy region DM2, to which a dummy gate voltage Vdm is applied to fix an electric potential of the dummy gate electrode 7b.

In the case in which a well formed on a silicon layer 3a to be a dummy active region is a p-type, it is preferable that a source potential should be set to 0 V and 0 V or a negative voltage should be applied as the dummy gate voltage Vdm. Consequently, a hole is accumulated in a portion of the silicon layer 3a which is provided under a dummy gate insulating film 4b so that a carrier is increased. Thus, a resistance value of the silicon layer 3a to be the dummy active region is further reduced.

If a well is an n-type, it is preferable that the source potential should be set to 0 V and 0 V or a positive voltage should be applied as the dummy gate voltage Vdm. Consequently, an electron is accumulated in a portion of the silicon layer 3a which is provided under the dummy gate insulating film 4b so that a carrier is increased. Thus, the resistance value of the silicon layer 3a to be the dummy active region is further reduced.

Since other structures are the same as the structure of the SOI device according to the third embodiment, their description will be omitted.

By using the SOI device according to the present embodiment, the resistance value of the silicon layer 3a to be the dummy active region can further be reduced because the dummy gate voltage Vdm is applied to the dummy gate electrode 7b.

<Fifth Embodiment>

The present embodiment indicates a variant of a structure in which the SOI device according to the first embodiment and the SOI device according to the third embodiment are combined. More specifically, the SOI device is constituted such that a dummy gate electrode is partially provided on a silicon layer 3a, the vicinity of the dummy gate electrode has the same structure as that of the SOI device according to the third embodiment and the vicinity of other portions in the silicon layer 3a has the same structure as that of the SOI device according to the first embodiment.

Figure 8:
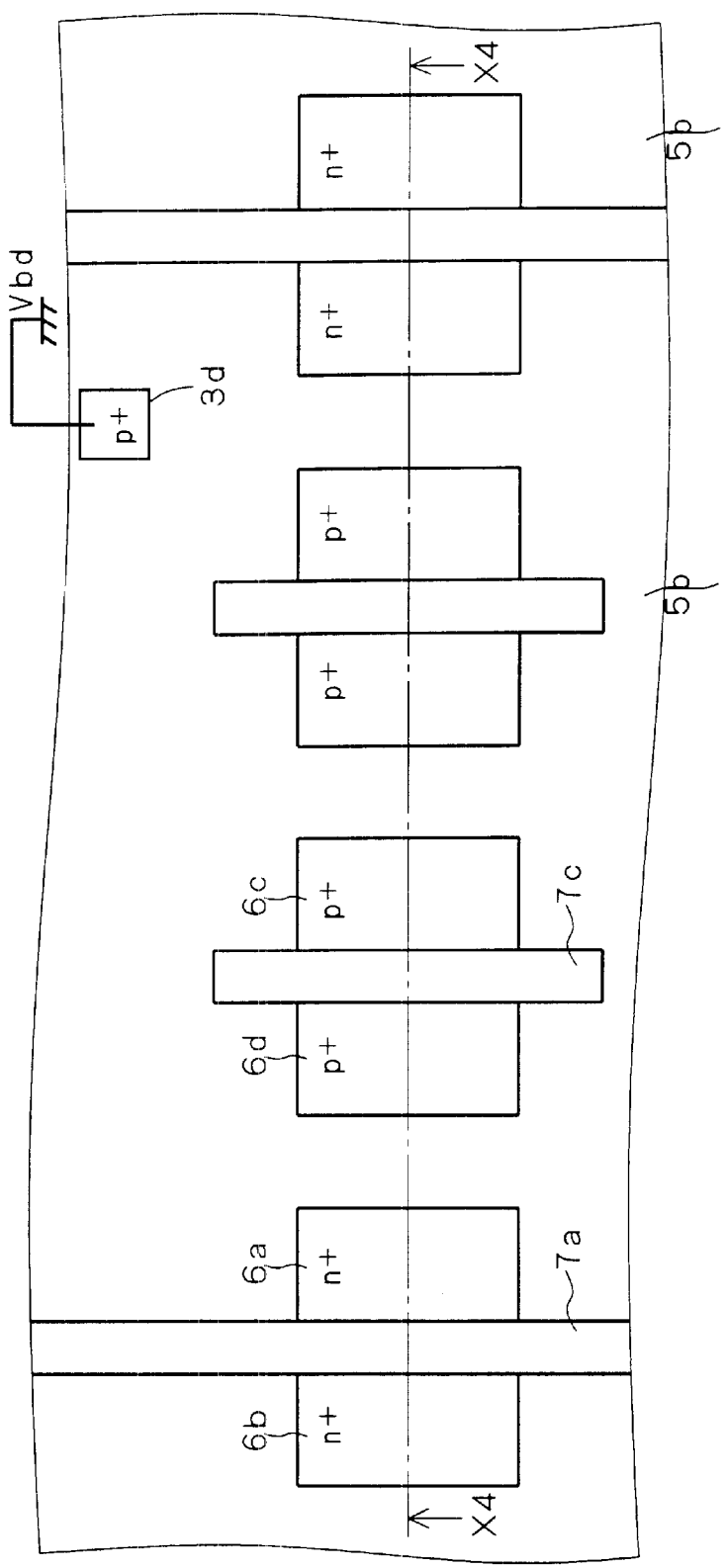
FIG. 8 is a top view showing an SOI device according to a fifth embodiment.
Figure 9:
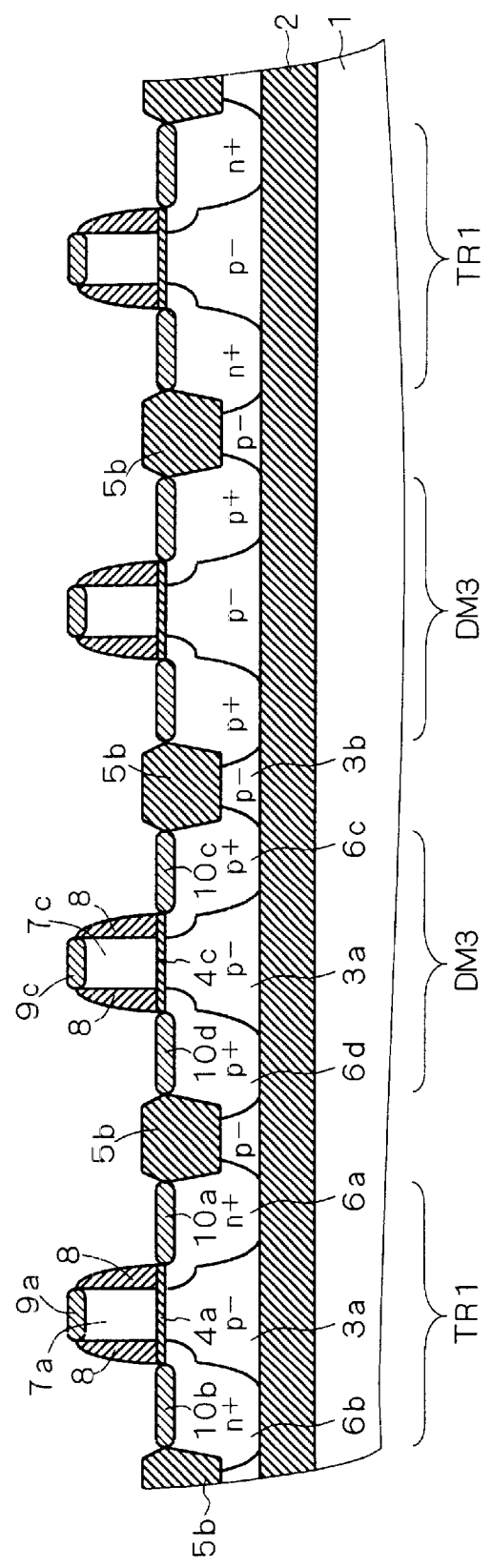
FIG. 9 is a sectional view showing the SOI device according to the fifth embodiment.

FIG. 8 is a top view showing an SOI device according to the present embodiment, and FIG. 9 is a sectional view taken along the line X4—X4 in FIG. 8. In FIGS. 8 and 9, elements having the same functions as those of the SOI device according to the third embodiment have the same reference numerals.

In the present embodiment, a dummy region DM3 having a structure similar to that of an MOS transistor is formed in place of the dummy region DM2, in which a dummy gate insulating film 4c, a dummy gate electrode 7c, a dummy drain region 6c and a dummy source region 6d are provided and the silicon layer 3a acts as a dummy body region. Since the silicon layer 3a, the dummy drain region 6c and the dummy source region 6d have the same conductivity type, the dummy region DM3 has a different structure from that of the MOS transistor.

Moreover, silicide regions 9c, 10c and 10d are formed on surfaces of the dummy gate electrode 7c, the dummy drain region 6c and the dummy source region 6d, respectively. Furthermore, a side wall 8 is formed on a side surface of the dummy gate electrode 7c.

As an example, FIG. 9 shows the case in which the dummy drain region 6c and the dummy source region 6d are provided deeply in contact with a buried insulating film 2.

Thus, the dummy region DM3 is formed in a partial isolating film 5b so that the occupation rate of a silicon layer 3b provided under the partial isolating film 5b in a semiconductor device is decreased. With the decrease in the silicon layer 3b, the occupation rate of the dummy drain region 6c, the dummy source region 6d, the silicon layer 3a to be the body region and the silicide regions 10c and 10d is increased.

In the dummy region DM3, the dummy drain region 6c and the dummy source region 6d may have different conductivity types from the conductivity type of the silicon layer 3a as in a drain region 6a and a source region 6b of an MOS transistor TR1. In that case, a body resistance is more raised than that in the case in which the body region, the dummy drain region 6c and the dummy source region 6d have the same conductivity type. However, by the provision of the dummy region DM3, a value of the body resistance can be more reduced than that in the prior art.

Since other structures are the same as the structure of the SOI device according to the first and third embodiments, their description will be omitted.

By using the SOI device according to the present embodiment, it is possible to obtain both the effects of the SOI devices according to the first and third embodiments at the same time.

<Sixth Embodiment>

Figure 10:
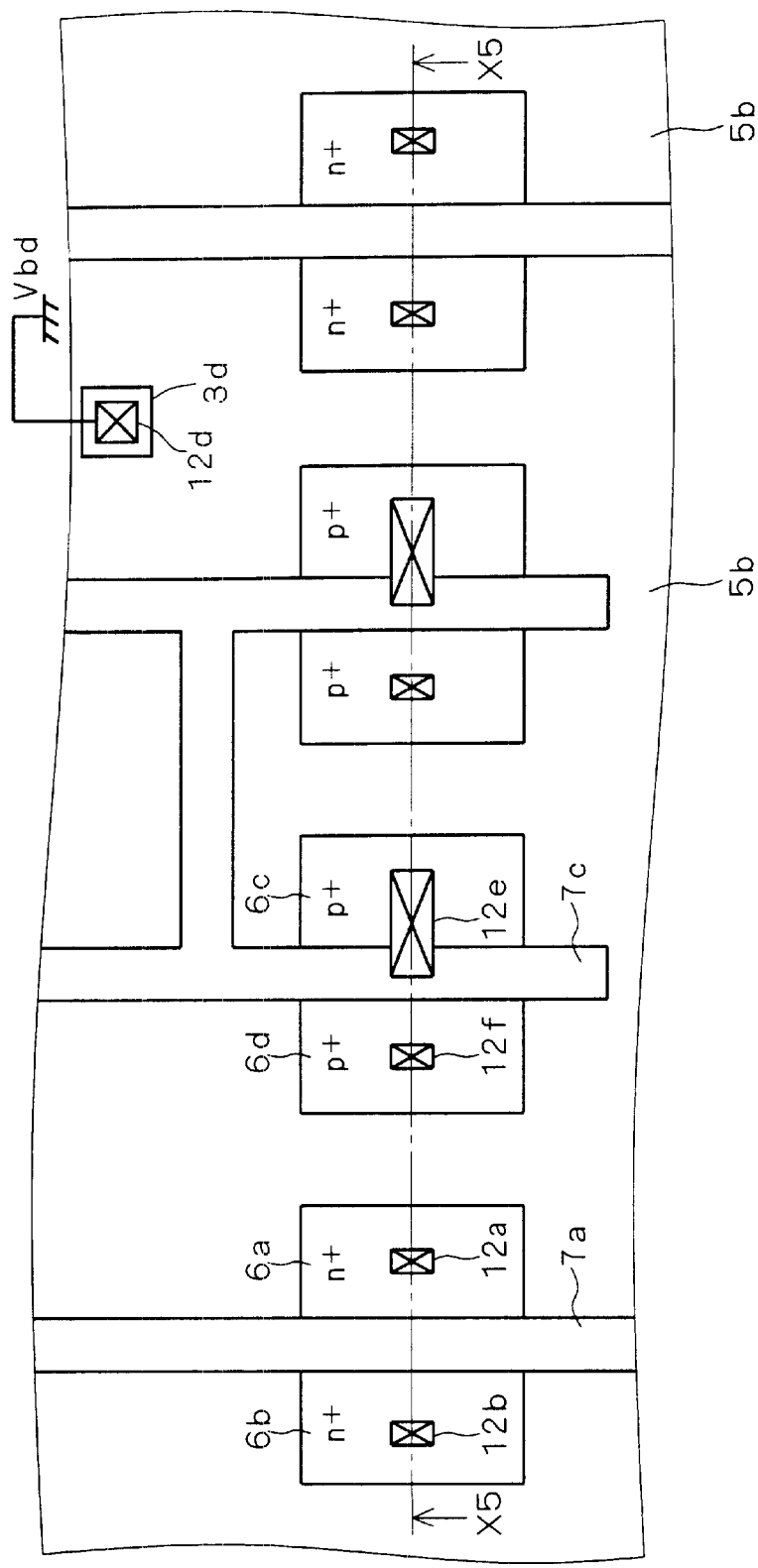
FIG. 10 is a top view showing an SOI device according to a sixth embodiment.
Figure 11:
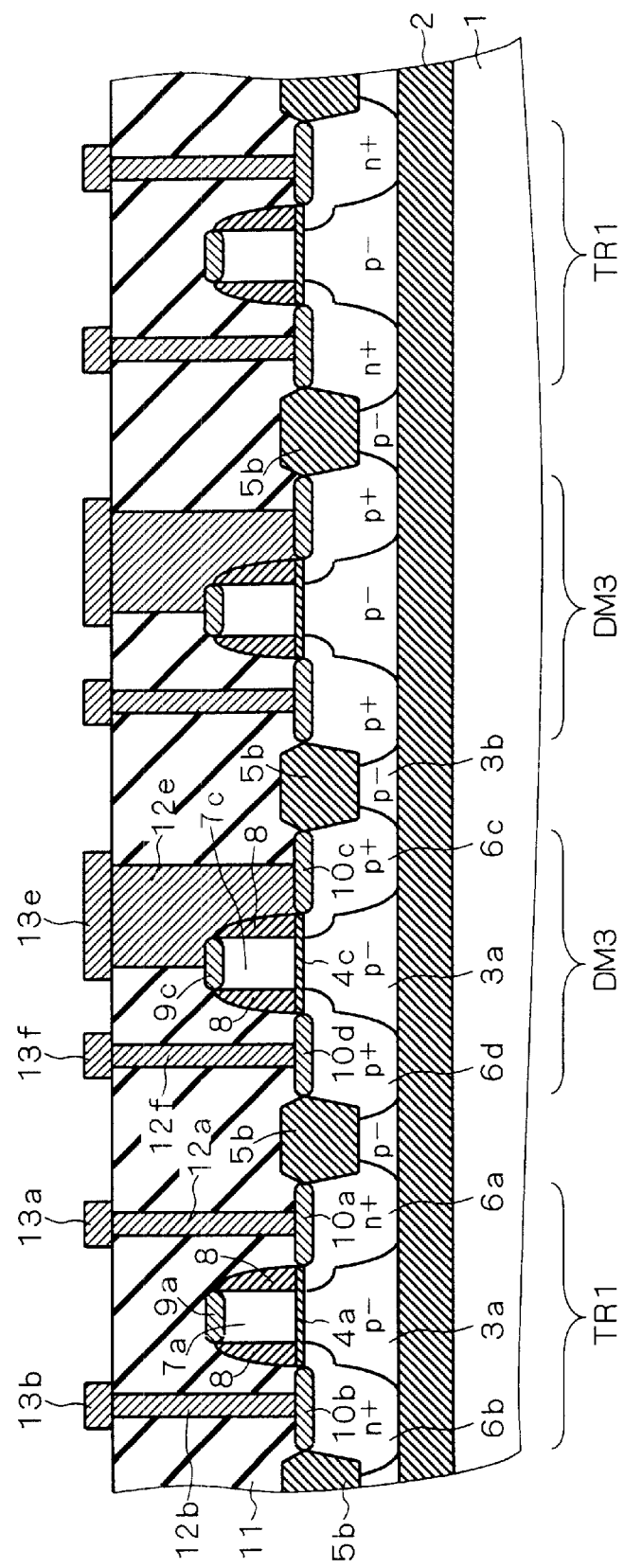
FIG. 11 is a sectional view showing the SOI device according to the sixth embodiment.

In the present embodiment, description will be given to a variant of the SOI device according to the fifth embodiment. FIG. 10 is a top view showing an SOI device according to the present embodiment, and FIG. 11 is a sectional view taken along the line X5—X5 in FIG. 10. In FIGS. 10 and 11, elements having the same functions as those of the SOI device according to the fifth embodiment have the same reference numerals.

In the present embodiment, dummy contact plugs 12e and 12f and dummy wirings 13e and 13f which are formed of a metal such as Al or a conductive material such as polysilicon are provided in order to further reduce a resistance value of a dummy region DM3.

In many cases, contact plugs 12a and 12b formed in an interlayer insulating film 11 are connected through silicide regions 10a and 10b to a drain region 6a and a source region 6b of an MOS transistor TR1 respectively as shown in FIG. 11, and wirings 13a and 13b are connected to the contact plugs 12a and 12b respectively. In the present embodiment, the same dummy contact plugs 12e and 12f as the contact plugs 12a and 12b are also connected to a dummy drain region 6c and a dummy source region 6d of the dummy region DM3 through silicide regions 10c and 10d respectively, and the same dummy wirings 13e and 13f as the wirings 13a and 13b are provided on the dummy contact plugs 12e and 12f respectively.

As shown in FIG. 11, it is preferable that a so-called shared contact structure should be employed in which at least one of the dummy contact plugs 12e and 12f is connected to a dummy gate electrode 7c (through a silicide region 9c). Consequently, an electric potential of the dummy gate electrode 7c can be fixed to have the same value as electric potentials of the dummy drain region 6c and the dummy source region 6d. Thus, a resistance value of the dummy region can be fixed.

Furthermore, it is preferable that the dummy gate electrode 7c having the shared contact structure should be connected across the adjacent dummy regions DM3. Consequently, an electrical path is formed by not only the dummy drain region 6c and dummy source region 6d and a silicon layer 3b but also the dummy gate electrode 7c between the adjacent dummy regions DM3. Thus, the resistance value of the dummy region DM3 can be reduced still more. Accordingly, a body potential can be controlled more easily all over a semiconductor device, and a floating-body problem and a hot carrier problem can be solved more reliably.

In the present embodiment, by the provision of the dummy wirings 13e and 13f in the same manner as the dummy wiring 13c according to the second embodiment, a variation in a height caused by the presence or absence of a wiring on the interlayer insulating film 11 can be suppressed. Consequently, in the case in which an interlayer insulating film (not shown) to be an upper layer is formed on the interlayer insulating film 11 and is subjected to a CMP method, a pressure applied to the upper interlayer insulating film can easily be made constant so that dishing is generated on the upper interlayer insulating film with difficulty.

By the provision of the dummy wirings 13e and 13f, furthermore, it is possible to suppress a self-heating effect which often makes troubles in the SOI device.

As shown in FIG. 10, a contact plug 12d is also provided in a body terminal region 3d. The body terminal region 3d is electrically connected to a body voltage Vbd.

Since other structures are the same as the structure of the SOI device according to the fifth embodiment, their description will be omitted.

By using the SOI device according to the present embodiment, since the dummy contact plugs 12e and 12f and the dummy wirings 13e and 13f are formed, the body potential can be controlled more easily all over the semiconductor device so that the floating-body problem and the hot carrier problem can be solved more reliably. Moreover, in the case in which the upper interlayer insulating film is further formed on the interlayer insulating film 11 and is subjected to the CMP method, the dishing is generated on the upper interlayer insulating film with difficulty. Furthermore, it is possible to suppress the self-heating effect which often makes troubles in the SOI device.

<Seventh Embodiment>

Figure 12:
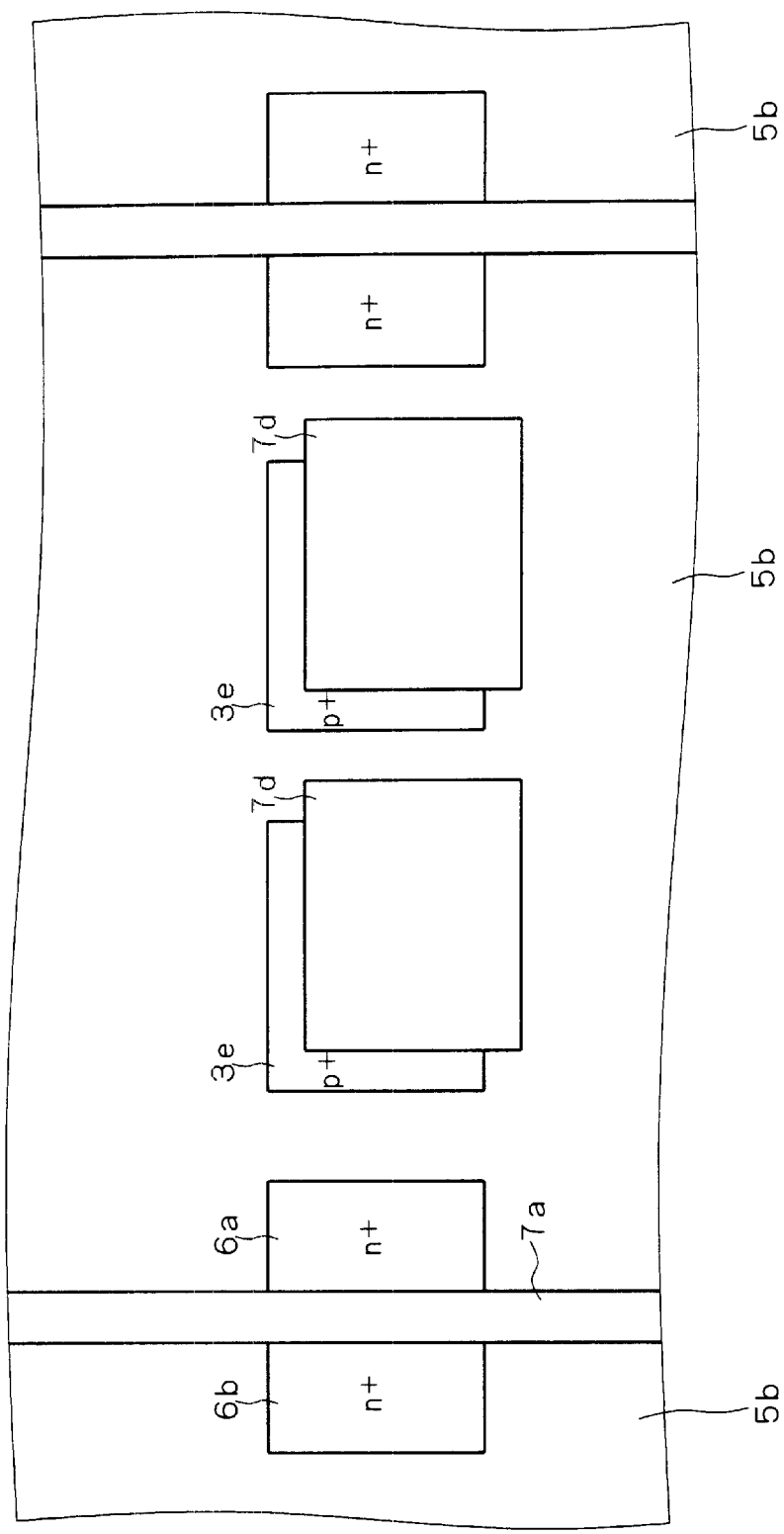
FIG. 12 is a top view showing an SOI device according to a seventh embodiment.

In the present embodiment, description will be given to a variant of the SOI device according to the fifth or sixth embodiment. FIG. 12 is a top view showing an SOI device according to the present embodiment. In FIG. 12, elements having the same functions as those of the SOI device according to the fifth or sixth embodiment have the same reference numerals.

In the present embodiment, a square dummy gate electrode 7d having the same size as the size of a silicon layer of a dummy region is slightly shifted from the dummy region in place of the dummy gate electrode 7c. A dummy active region 3e is formed in a silicon layer which is not covered with the dummy gate electrode 7d. The dummy active region 3e has such a shape as to be partially taken away from a square analogous to the square of the dummy gate electrode 7d. Moreover, a silicide region may be formed on surfaces of the dummy gate electrode 7d and the dummy active region 3e.

Since other structures are the same as the structure of the SOI device according to the fifth or sixth embodiment, their description will be omitted.

With the structures of the dummy gate electrode 7d and the dummy active region 3e of the SOI device according to the present embodiment, it is possible to solve a floating-body problem and a hot carrier problem in the same manner as the SOI device according to the fifth or sixth embodiment.

<Eighth Embodiment>

Figure 13:
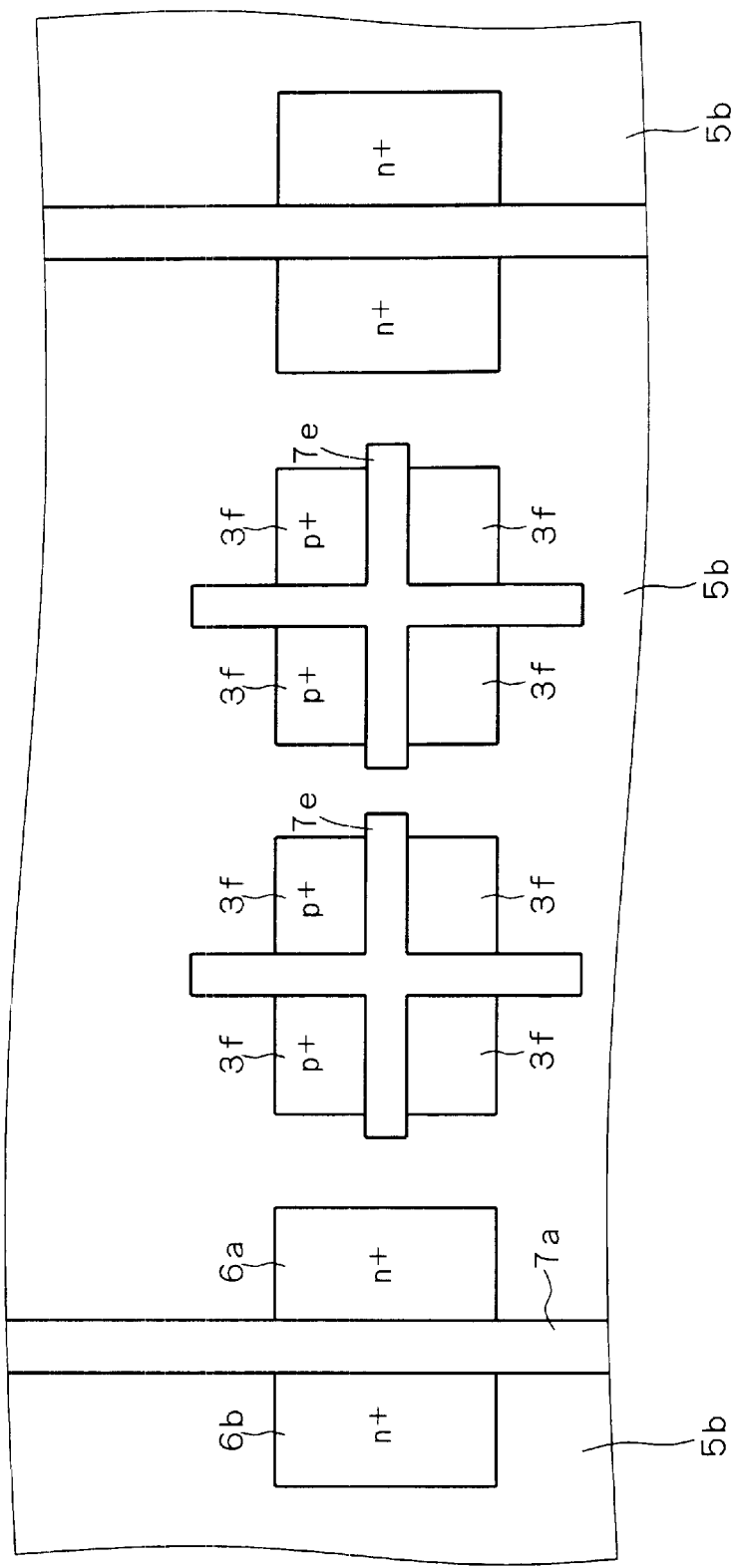
FIG. 13 is a top view showing an SOI device according to an eighth embodiment.

Also in the present embodiment, description will be given to a variant of the SOI device according to the fifth or sixth embodiment. FIG. 13 is a top view showing an SOI device according to the present embodiment. In FIG. 13, elements having the same functions as those of the SOI device according to the fifth or sixth embodiment have the same reference numerals.

In the present embodiment, a dummy gate electrode 7e covering a silicon layer of a dummy region in the form of a cross is provided in place of the dummy gate electrode 7c. A dummy active region 3f is formed on a silicon layer which is not covered with the dummy gate electrode 7e. While the dummy active region 3f is divided into a plurality of portions by the cross-shaped dummy gate electrode 7e, it wholly constitutes a parallelogram having four sides parallel with each side constituting the cross shape of the dummy gate electrode 7e. Moreover, a silicide region may be formed on surfaces of the dummy gate electrode 7e and the dummy active region 3f.

Since other structures are the same as the structure of the SOI device according to the fifth or sixth embodiment, their description will be omitted.

With the structures of the dummy gate electrode 7e and the dummy active region 3f of the SOI device according to the present embodiment, it is possible to solve a floating-body problem and a hot carrier problem in the same manner as the SOI device according to the fifth or sixth embodiment.

By the dummy gate electrode having the cross-shaped structure according to the present embodiment, the following advantages can be obtained as compared with the dummy gate electrode according to the seventh embodiment, for example.

FIG. 14 is a view showing an electric resistance between A and B points interposing the dummy region in the case in which the dummy gate electrode 7e is used. A partial isolating film 5b has a resistance R1 as the resistance between the A and B points interposing the dummy region.

Furthermore, a resistance R2 of a region 3f1 on the upper left of the dummy active region 3f divided by the cross-shaped dummy gate electrode 7e, a resistance R4 of a region 3f2 on the upper right of the dummy active region 3f divided by the cross-shaped dummy gate electrode 7e and a resistance R3 of a silicon layer 3a1 provided under the dummy gate electrode 7e interposed between the regions 3f1 and 3f2 are connected in series for the resistance between the A and B points.

Similarly, a resistance R6 of a region 3f3 on the lower left of the dummy active region 3f divided by the cross-shaped dummy gate electrode 7e, a resistance R8 of a region 3f4 on the lower right of the dummy active region 3f divided by the cross-shaped dummy gate electrode 7e and a resistance R7 of a silicon layer 3a3 provided under the dummy gate electrode 7e interposed between the regions 3f3 and 3f4 are connected in series for the resistance between the A and B points.

A resistance R5 of a silicon layer 3a2 provided under a transverse straight portion of the cross-shaped dummy gate electrode 7e also exists as the resistance between the A and B points.

On the other hand, FIG. 15 is a view showing an electric resistance between C and D points interposing the dummy region in the case in which the dummy gate electrode 7d is used. A partial isolating film 5b has a resistance R9 as the resistance between the C and D points interposing the dummy region.

Furthermore, a resistance R10 of a rectangular portion 3e1 existing in parallel with a line connecting C and D in the dummy active region 3e of a portion which is not covered with the dummy gate electrode 7d also exists as the resistance between the C and D points.

Moreover, there is a composite resistance R11 having a series connection of a resistance R13 of a silicon layer 3a4 provided under a portion covered with the dummy gate electrode 7d and a resistance R12 of a dummy active region 3e2 which is a portion excluding the rectangular portion 3e1 of the dummy active region 3e in the portion which is not covered with the dummy gate electrode 7d.

Description will be given to the case in which the dummy gate electrodes 7d and 7e are shifted in AB and CD directions so that a shifted pattern is formed.

In FIG. 14, each of values of the resistances R2, R4, R6 and R8 is changed with a shift in the AB direction. However, the sum of the resistances R2 and R4 and that of the resistances R6 and R8 are not changed depending on the shift in the AB direction. The reason is that the regions 3f1 and 3f2 are formed of the same material and the total area has a constant value, and so are the regions 3f3 and 3f4.

Each of values of the resistances R1, R3, R5 and R7 is not changed depending on the shift in the AB direction.

In FIG. 14, accordingly, even if the dummy gate electrode 7e is shifted in the AB direction so that the shifted pattern is formed, the dummy region has a resistance value which is not changed and is rarely influenced by alignment accuracy of a mask pattern.

In order not to change the resistance value of the dummy region even if the dummy gate electrode 7e is thus shifted and the shifted pattern is formed, it is preferable that a silicon layer having the dummy active region 3f formed thereon should constitute a parallelogram having four sides parallel with each side forming a cross shape of a dummy gate.

On the other hand, in FIG. 15, each of values of the resistances R12 and R13 is changed depending on the shift in the CD direction. Each of values of the resistances R9 and R10 is not changed depending on the shift in the CD direction.

In this case, each of the values of the resistances R12 and R13 is changed depending on the shift in the CD direction. Because the dummy active region 3e2 and the silicon layer 3a4 are formed of different materials. Therefore, the resistances R12 and R13 are changed in different ways. Accordingly, in the case in which the dummy gate electrode 7d is shifted in the CD direction so that the shifted pattern is formed, the value of the composite resistance R11 is changed. In this case, accordingly, the dummy region has a resistance value which is easily influenced by the alignment accuracy of the mask pattern.

The cross shape of the dummy gate electrode has the above-mentioned advantages.

<Ninth Embodiment>

Figure 17:
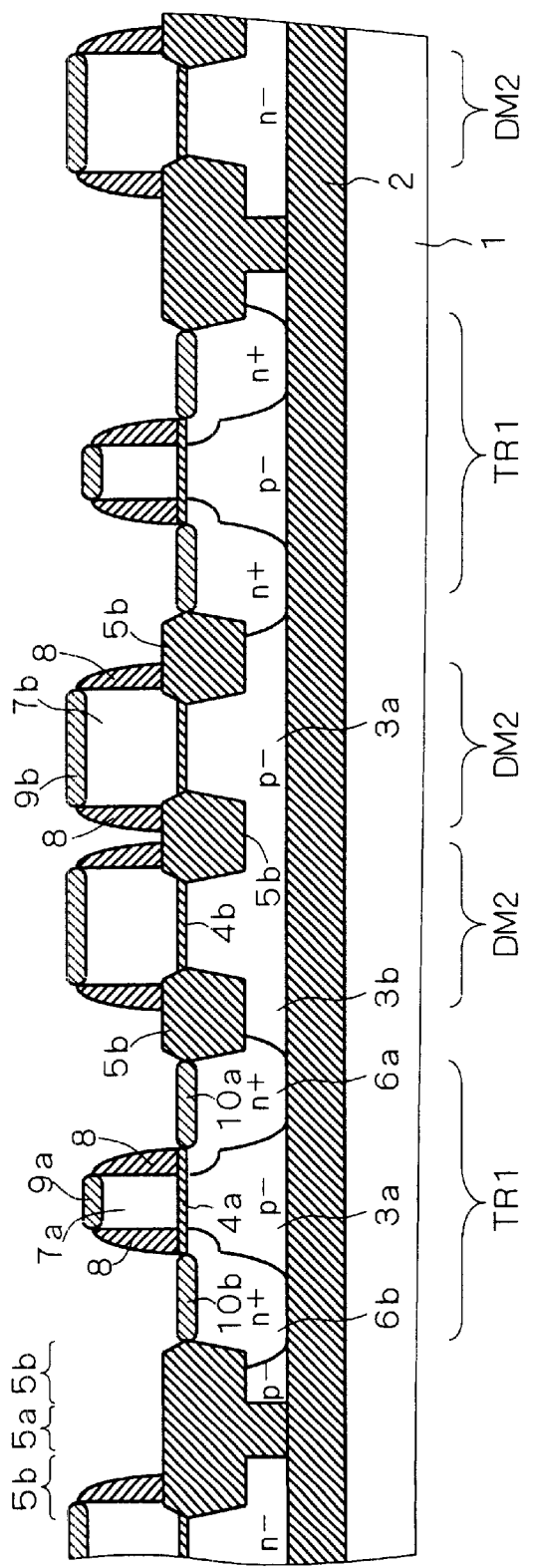
FIG. 17 is a sectional view showing the SOI device according to the ninth embodiment.

In the present embodiment, description will be given to a variant of the SOI device according to the third embodiment. FIG. 16 is a top view showing an SOI device according to the present embodiment, and FIG. 17 is a sectional view taken along the line X6—X6 in FIG. 16. In FIGS. 16 and 17, elements having the same functions as those of the SOI device according to the third embodiment have the same reference numerals.

In the present embodiment, a complete isolating film 5a is used together with a partial isolating film 5b. As shown in FIGS. 16 and 17, an MOS transistor TR1 and a dummy region DM2 present therearound are provided in one well and the complete isolating film 5a is provided in a boundary portion of the well.

Also in the case in which the partial isolating film 5b and the complete isolating film 5a are thus used together, the provision of the dummy region DM2 can produce the same effects as those in the third embodiment. Moreover, the complete isolating film is used. Therefore, a high tolerance to latch up and noises can be obtained.

The present embodiment is not applied to only the SOI device according to the third embodiment but can also be applied to each of the above-mentioned other embodiments. In that case, it is possible to obtain effects corresponding to each embodiment.

<Tenth Embodiment>

In the present embodiment, description will be given to a method of arranging a dummy region DM1 in the SOI device according to the first embodiment.

The dummy region DM1 is formed by photolithography using a photomask having a pattern to define a dummy active region 3c. Accordingly, an arrangement pattern of the dummy active region 3c is equivalent to that of the dummy region DM1.

A method of determining the arrangement pattern of the dummy active region 3c will be described below.

Figure 18:
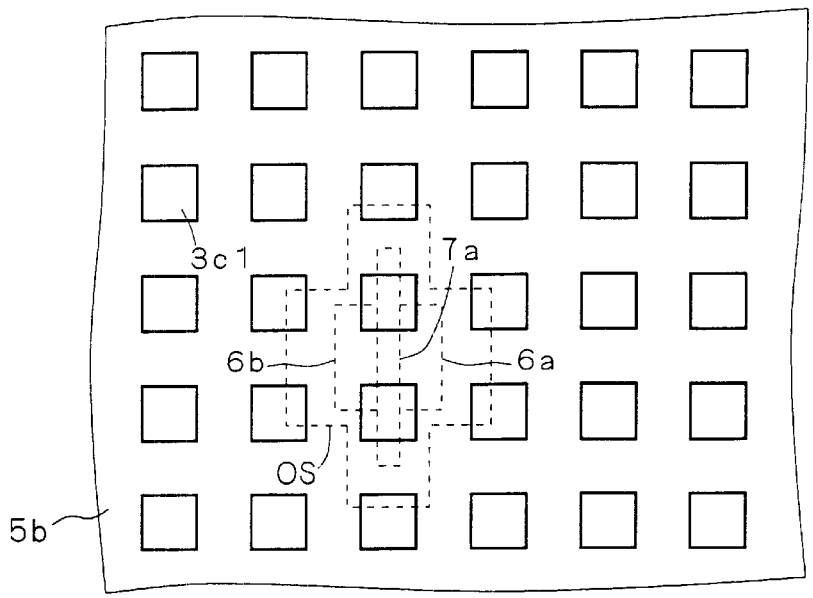

First of all, a design drawing for a photomask having a pattern 3c1 of the dummy active region 3c regularly arranged as shown in FIG. 18 is prepared. The design drawing may be an actual drawing or electronic data on a CAD.

Next, a design drawing for a photomask having patterns of an element and a circuit in an SOI device such as an MOS transistor TR1 described thereon is prepared.

These two design drawings are superposed. In FIG. 18, the patterns of the element and the circuit are shown in a broken line. When the two design drawings are superposed, the pattern 3c1 of the dummy active region 3c in which the patterns of the element and the circuit are superposed is erased. Moreover, the pattern 3c1 of the dummy active region 3c existing within the range of an oversize image OS having the patterns of the element and the circuit slightly enlarged is also erased.

Figure 19:
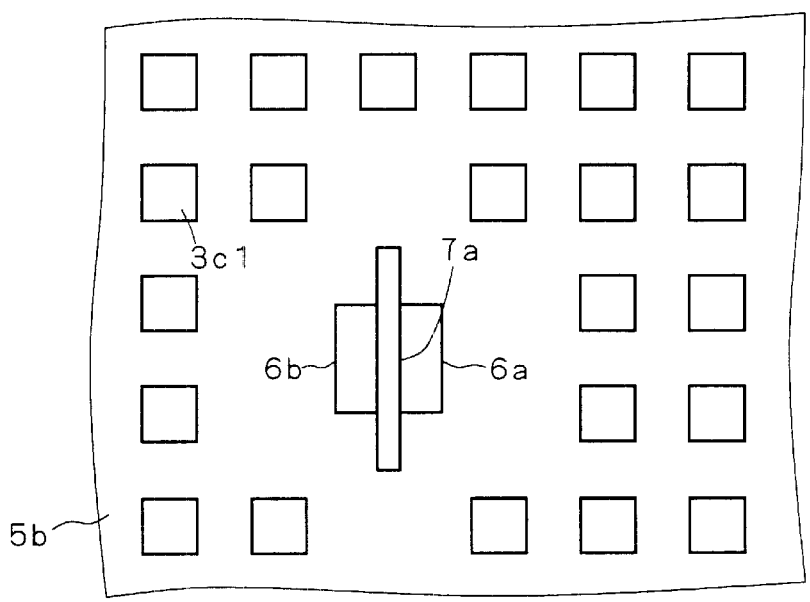

Consequently, an arrangement drawing shown in FIG. 19 is obtained. By thus erasing the pattern 3c1 of the dummy active region 3c in the portion in which the patterns of the element and the circuit are superposed and the pattern 3c1 of the dummy active region 3c existing within the range of the oversize image OS, it is possible to prevent the element and the circuit from being short-circuited through the dummy active region 3c.

Figure 20:
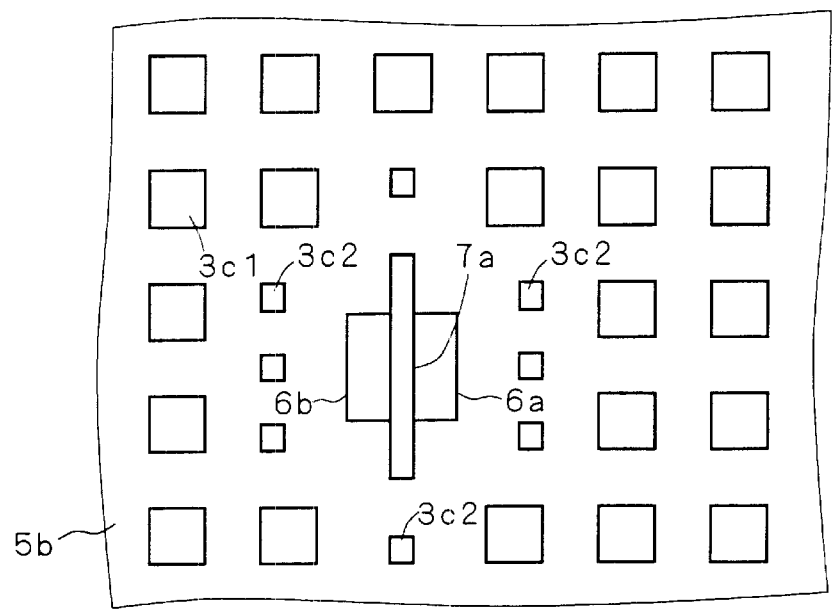

In the arrangement drawing of FIG. 19, the portion in which the pattern 3c1 of the dummy active region 3c is erased has a greater isolating film region than other regions and loses a balance. As shown in FIG. 20, therefore, another smaller pattern 3c2 than the pattern 3c1 may be formed in a part provided out of the range of the oversize image OS in the portion in which the pattern 3c1 is erased. If plural kinds of patterns of the dummy active region 3c are thus provided, a density of the isolating film is made uniform and the stability of a process such as CMP can be obtained effectively.

Figure 21:
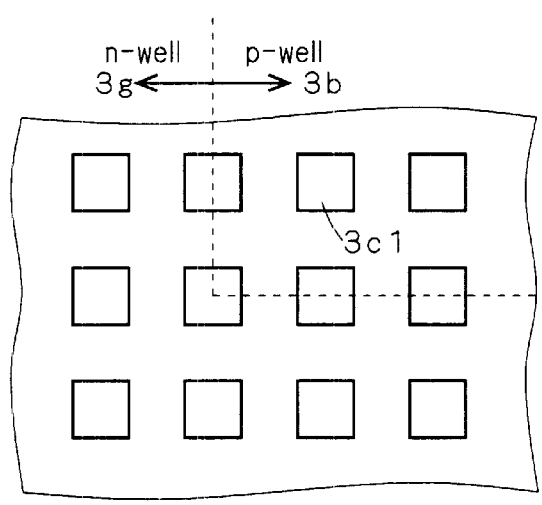

In place of the design drawing for the photomask in which the patterns of the element and the circuit are described, a design drawing for a photomask having a pattern of wells of a silicon layer in the SOI device described thereon is prepared. Both design drawings are superposed to erase the pattern 3c1 of the dummy active region 3c existing on the boundary of the wells. This is shown in FIGS. 21 and 22 in which the pattern 3c1 of the dummy active region 3c existing on the boundary of an n-type well 3g and a p-type well 3b is erased.

Thus, the pattern 3c1 of the dummy active region 3c existing on the boundary of the well is erased so that it is possible to prevent the wells from being short-circuited through the dummy active region 3c.

The method of arranging a dummy region according to the present embodiment is not applied to only the SOI device according to the first embodiment but can also be applied to each of the above-mentioned other embodiments.

<Eleventh Embodiment>

Figure 23:
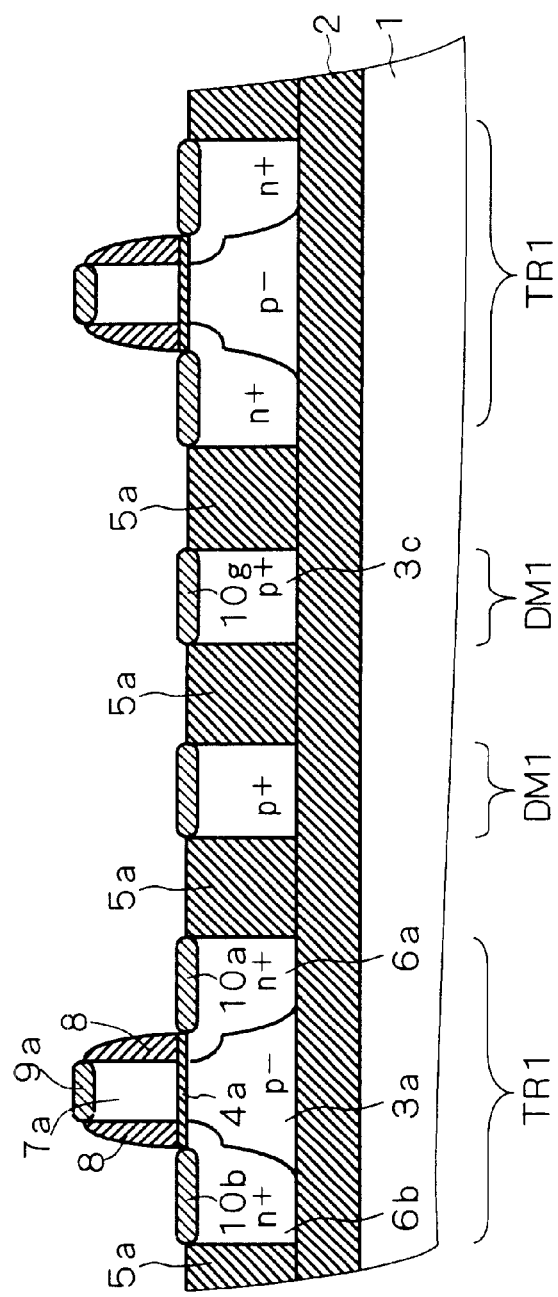
FIGS. 23 and 24 are sectional views showing an SOI device according to an eleventh embodiment.

In the present embodiment, description will be given to a variant of the SOI device according to the first embodiment. FIG. 23 is a sectional view showing an SOI device according to the present embodiment. In FIG. 23, elements having the same functions as those of the SOI device according to the first embodiment have the same reference numerals.

In the present embodiment, a complete isolating film 5a is used in place of the partial isolating film 5b. Since other structures are the same as those in the SOI device according to the first embodiment, their description will be omitted.

Also in the case in which only the complete isolating film 5a is used for insulation between elements, the dummy region DM1 of the SOI device according to the first embodiment can produce the following effects and is therefore effective.

More specifically, a tensile stress of the complete isolating film 5a can be distributed over the dummy region DM1. Consequently, it is possible to reduce force applied to an MOS transistor TR1 or the like by the tensile stress. Accordingly, a crystal defect is generated with difficulty in a drain region 6a and a source region 6b.

By the provision of the dummy region DM1, a constant pressure can easily be applied to a wafer when the complete isolating film 5a is to be formed by using a CMP method. Consequently, dishing is caused on the complete isolating film 5a with difficulty. In the case in which the complete isolating film 5a is formed by plasma etching, the state of a plasma can be uniformly maintained on the wafer because the complete isolating film 5a is properly distributed. Accordingly, it is possible to enhance the stability of a forming process for the complete isolating film 5a.

Since a semiconductor element is enclosed with a buried insulating film 2 and the complete isolating film 5a which are formed of an oxide film or the like having a comparatively small thermal conductivity, a self-heating effect is easily generated. However, the dummy region DM1 is provided to contribute to heat radiation. Thus, the self-heating effect can be prevented from being generated.

In the SOI device, the buried insulating film 2 is formed. Therefore, the gettering capability of heavy metals is lower than that in a device formed on a bulk substrate.

In the case in which the bulk substrate is used, a polycrystalline silicon layer is often formed on a back face of a wafer and is used as a gettering site for hazardous heavy metals such as Fe, Cu, Cr, Ni, Pt and the like. In the SOI device, however, the buried insulating film 2 is formed. Therefore, the movement of the heavy metals is easily blocked. Consequently, the gettering capability of the heavy metals is reduced.

It has been known that an interface between a silicon layer and a buried oxide film also acts as a gettering site for the heavy metals. Accordingly, the provision of the dummy region DM1 can increase the area of the interface between the silicon layer and the buried oxide film. Thus, the gettering capability can be enhanced. As a result, the reliability of a gate insulating film can be enhanced and a leakage current can be prevented from being generated in a pn junction interface.

Figure 24:
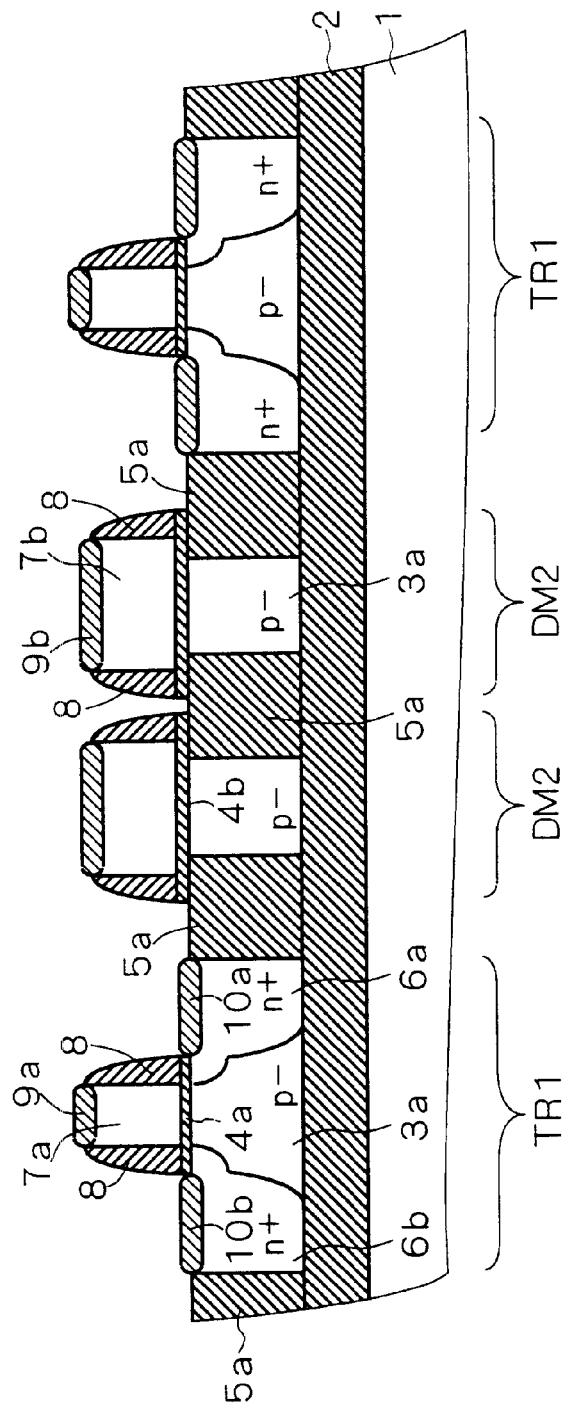

Also in the SOI devices other than the SOI device according to the first embodiment, the dummy region can effectively function with the complete isolating film 5a used in place of the partial isolating film 5b. For example, FIG. 24 shows the case in which the complete isolating film 5a is used in place of the partial isolating film 5b in the SOI device according to the second embodiment.

Also in each of the above-mentioned other embodiments, thus, the complete isolating film 5a can be applied in place of the partial isolating film 5b.

Since silicon layers 3a and 3c are completely insulated through the complete isolating film 5a and the buried oxide film 2, their conductivity types may be n or p.

For example, Japanese Patent Application Laid-Open No. 8-32049 (1996) and Japanese Patent Application Laid-Open No. 10-321549 (1998) have described an SOI device comprising a complete isolating film in which a dummy region for a silicon layer is provided.

<Twelfth Embodiment>

In the present embodiment, an SOI device according to the fifth or sixth embodiment will be taken as an example and a manufacturing method thereof will be described with reference to FIGS. 25 to 41.

Figure 25:
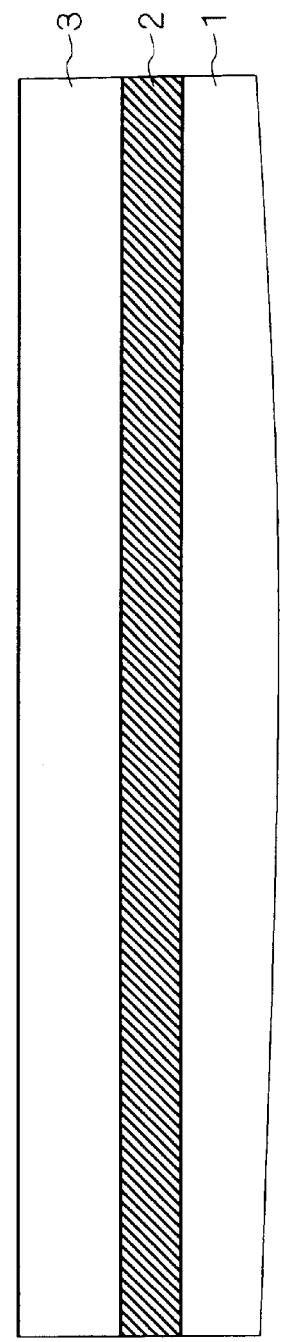
FIGS. 25 to 44 are views showing a method of manufacturing an SOI device according to a twelfth embodiment.

First of all, a substrate 1 formed of silicon or the like is prepared and a buried oxide film 2 and a silicon layer 3 are formed on the substrate 1 by a bonding method or the like. Thus, an SOI substrate shown in FIG. 25 is formed. As an example, the buried oxide film 2 has a thickness of approximately 100 to 500 nm and the silicon layer 3 has a thickness of approximately 30 to 400 nm. For a power device, the silicon layer 3 has a thickness of approximately several $\mu$m to several tens $\mu$m.

Next, an insulating film 4 is formed on the SOI substrate. A thermal oxide film, a TEOS oxide film and the like may be used for the insulating film 4. The insulating film 4 has a thickness of approximately 5 to 40 nm, for example. Then, a mask layer 21 for forming a partial isolating film is provided on the insulating film 4. For example, the mask layer 21 has a thickness of approximately 50 to 300 nm. A nitride film may be used for the mask layer 21, for example. The nitride film can be formed by a LPCVD (Low Pressure Chemical Vapor Deposition) method, a plasma CVD method or the like.

Figure 26:
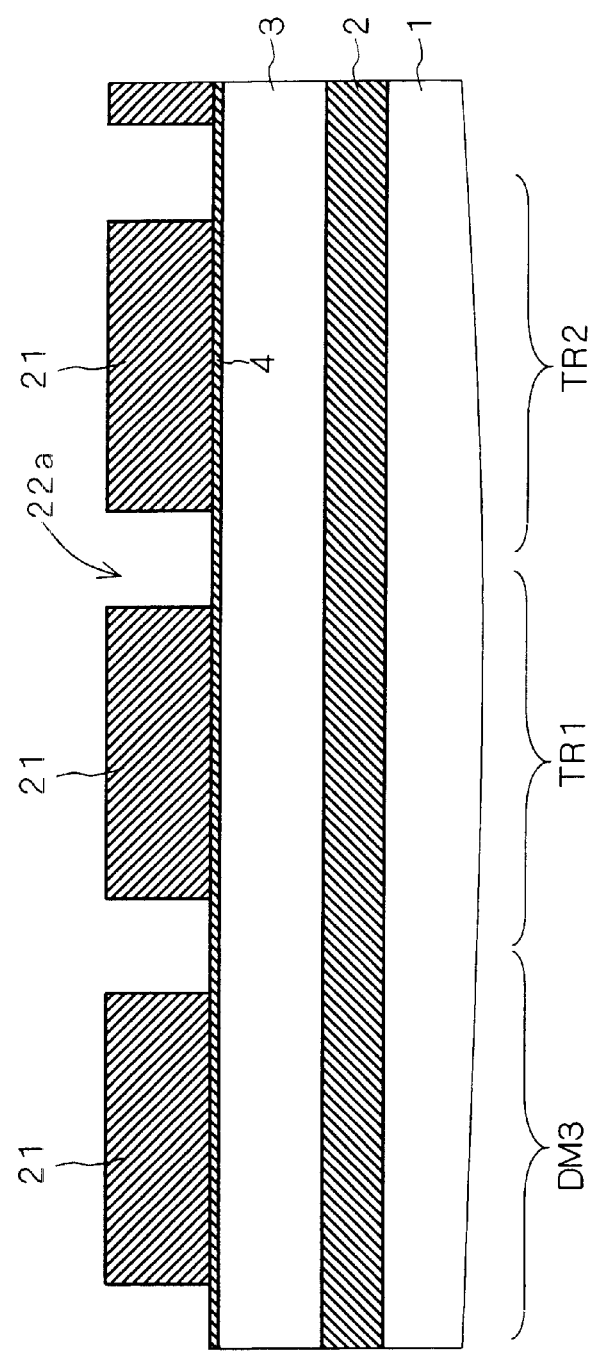

Patterning is carried out to the mask layer 21 by photolithography. More specifically, a photoresist is formed on the mask layer 21 and is subjected to the patterning. Then, the mask layer 21 is etched by using a RIIE (Reactive Ion Etching) system or an ECR (Electron Cyclotron Resonance) system by using the photoresist as a mask. Thereafter, the photoresist is removed by using an ashing system and a mixed solution of sulfuric acid and aqueous hydrogen peroxide. This state is shown in FIG. 26. In FIG. 26, a region forming a dummy region is indicated as DM3, a region forming an n-channel type MOS transistor is indicated as TR1 and a region forming a p-channel type MOS transistor is indicated as TR2. Moreover, a pattern 22a for forming a partial isolating film is provided in a boundary portion of each region.

Figure 27:
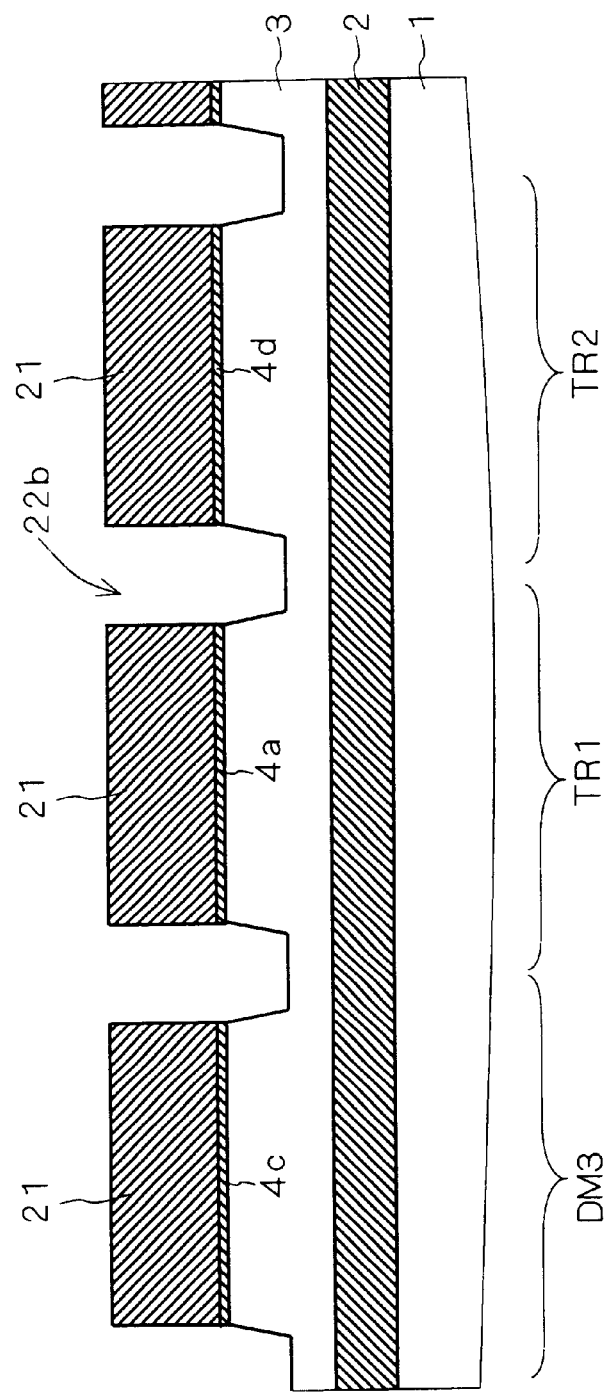

Next, the gate insulating film 4 and the silicon layer 3 are etched by using the RIE system or the ECR system so that a trench 22b is formed (FIG. 27). When the silicon layer 3 is to be etched, it is necessary to take care not to penetrate through the silicon layer 3 in order to form the partial isolating film. Consequently, the insulating film 4 is divided into regions of gate insulating films 4a, 4c and 4d.

Subsequently, a material of the partial isolating film such as an oxide film is provided to fully bury the trench 22b. A plasma TEOS oxide film or the like formed by using an HDP (High Density Plasma) system may be used for the material, for example. Preferably, the material of the partial isolating film is set to have a thickness of approximately 100 to 500 nm, for example.

Figure 28:
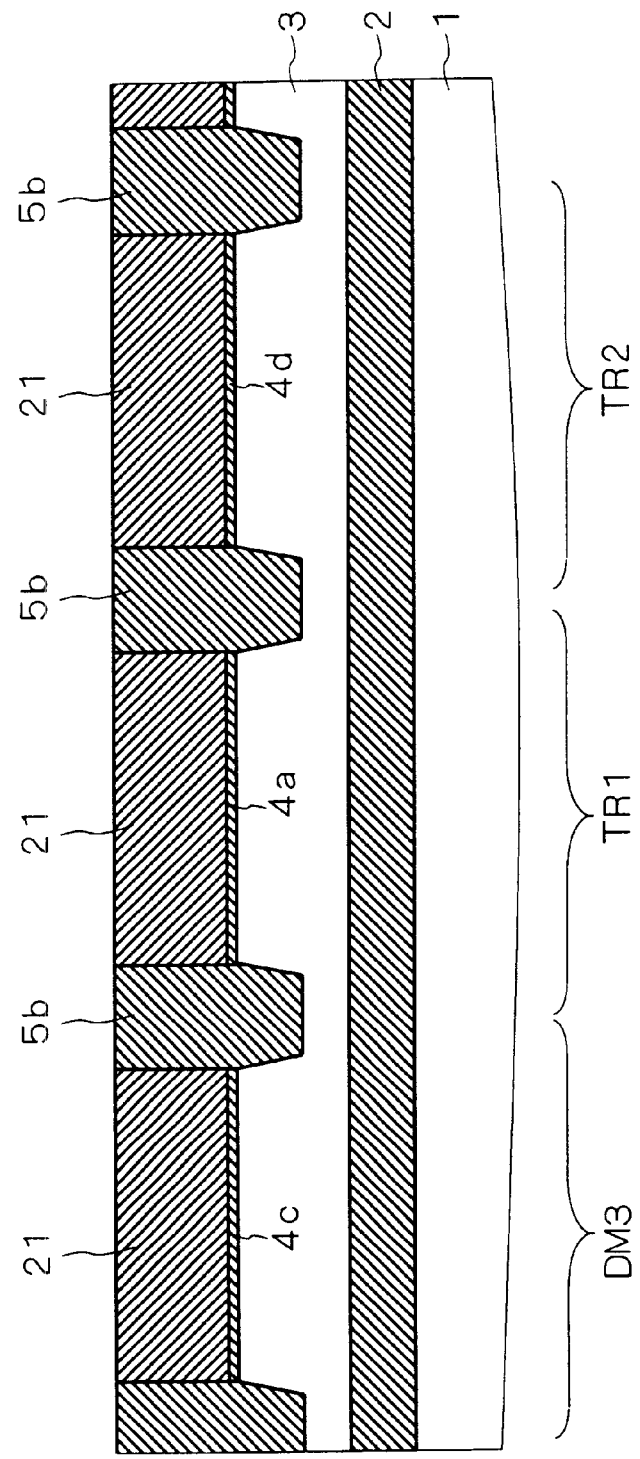

The surface is flattened by a CMP method (FIG. 28). Then, a heat treatment is carried out at a temperature of approximately 1000 to 1100° C. to enhance the quality of the material of a deposited film. Thus, a partial isolating film 5b is formed in the trench 22b. If a high temperature heat treatment is carried out at approximately 900 to 1000° C. to round corner portions of an upper part and a bottom of the trench 22b before the material of the partial isolating film is deposited, a tensile stress of the material deposited as the partial isolating film 5b can be reduced effectively.

Figure 29:
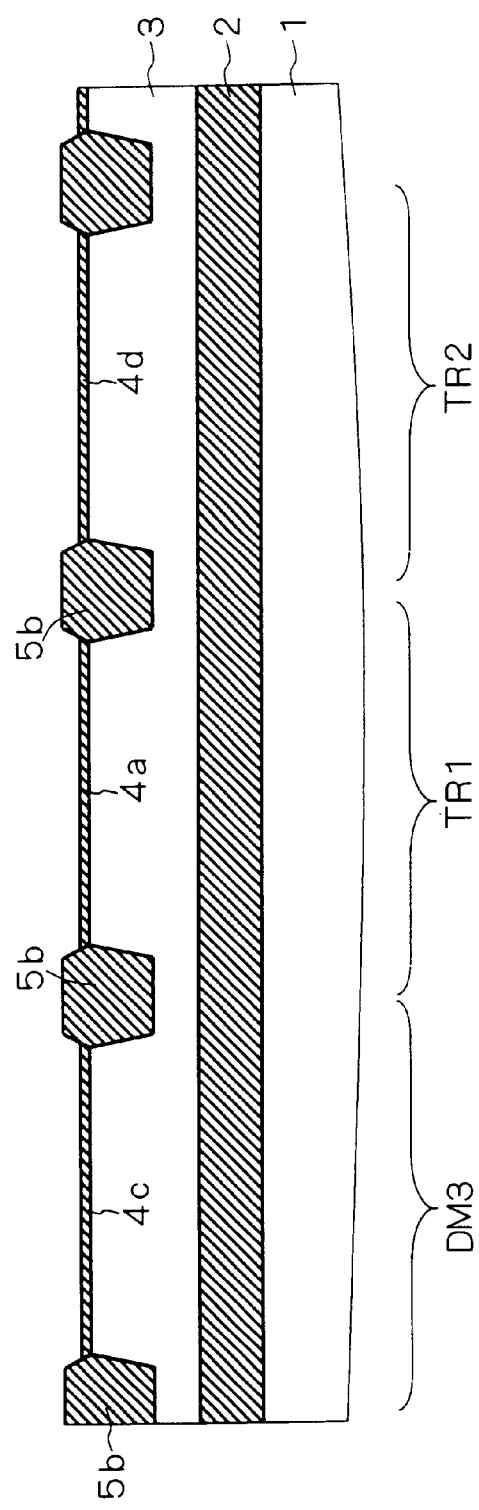

Next, the partial isolating film 5b is etched back by wet etching or using the RIE system or the ECR system and a height of a surface of the partial isolating film 5b is adjusted. The mask layer 21 is removed with high temperature phosphoric acid, for example (FIG. 29). Gate insulating films 4a, 4c and 4d may also be removed during the removal of the mask layer 21 such that new gate insulating films 4a, 4c and 4d are provided by thermal oxidation and deposition.

Figure 30:
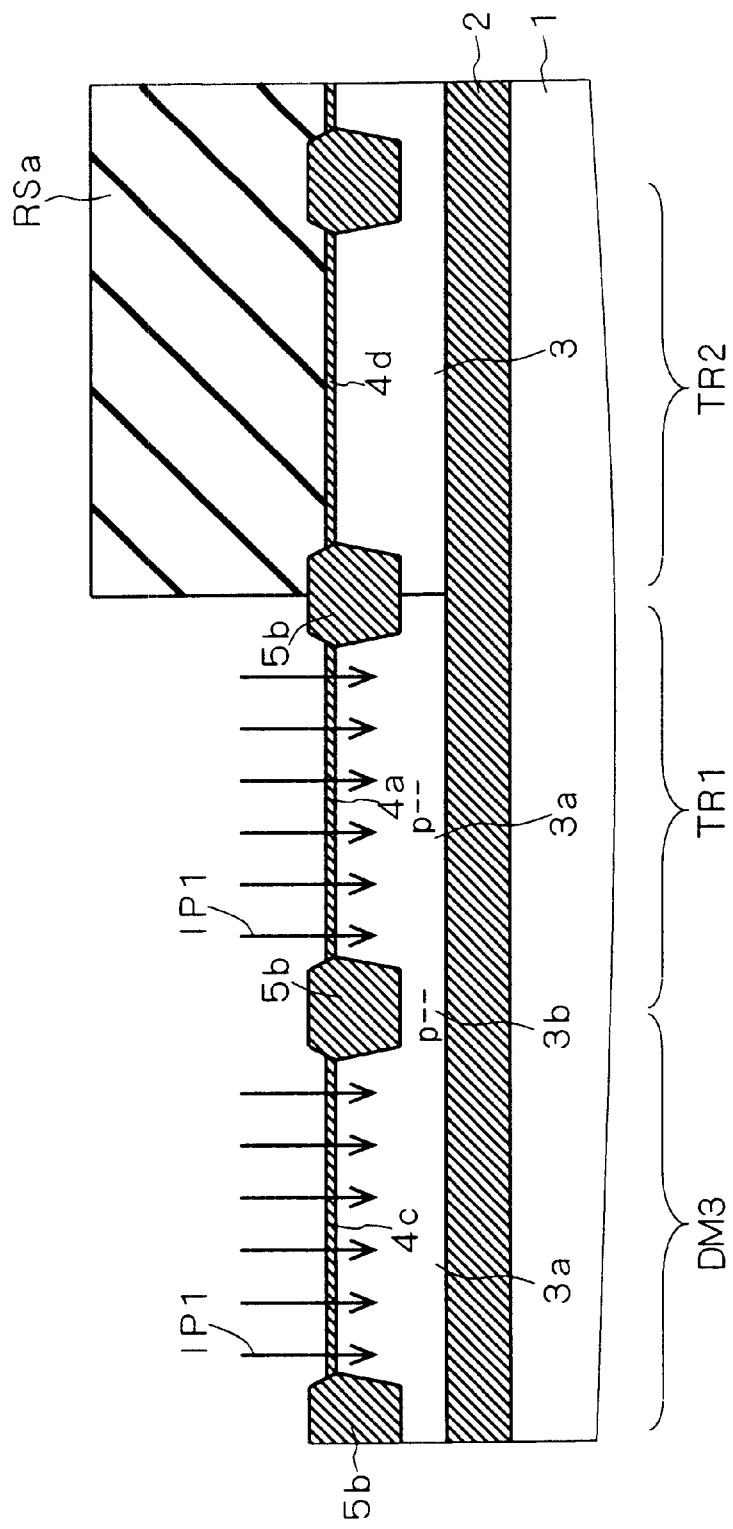

Then, a photoresist RSa is formed in a region of an MOS transistor TR2 to act as a mask for impurity injection. An impurity IPl such as B, $BF_2$ or In is injected into the silicon layer 3 of the dummy region DM3 and the MOS transistor TR1 region. Consequently, a p-type well is formed (FIG. 30). Silicon layers 3a and 3b form a part of the p-type well.

Figure 31:
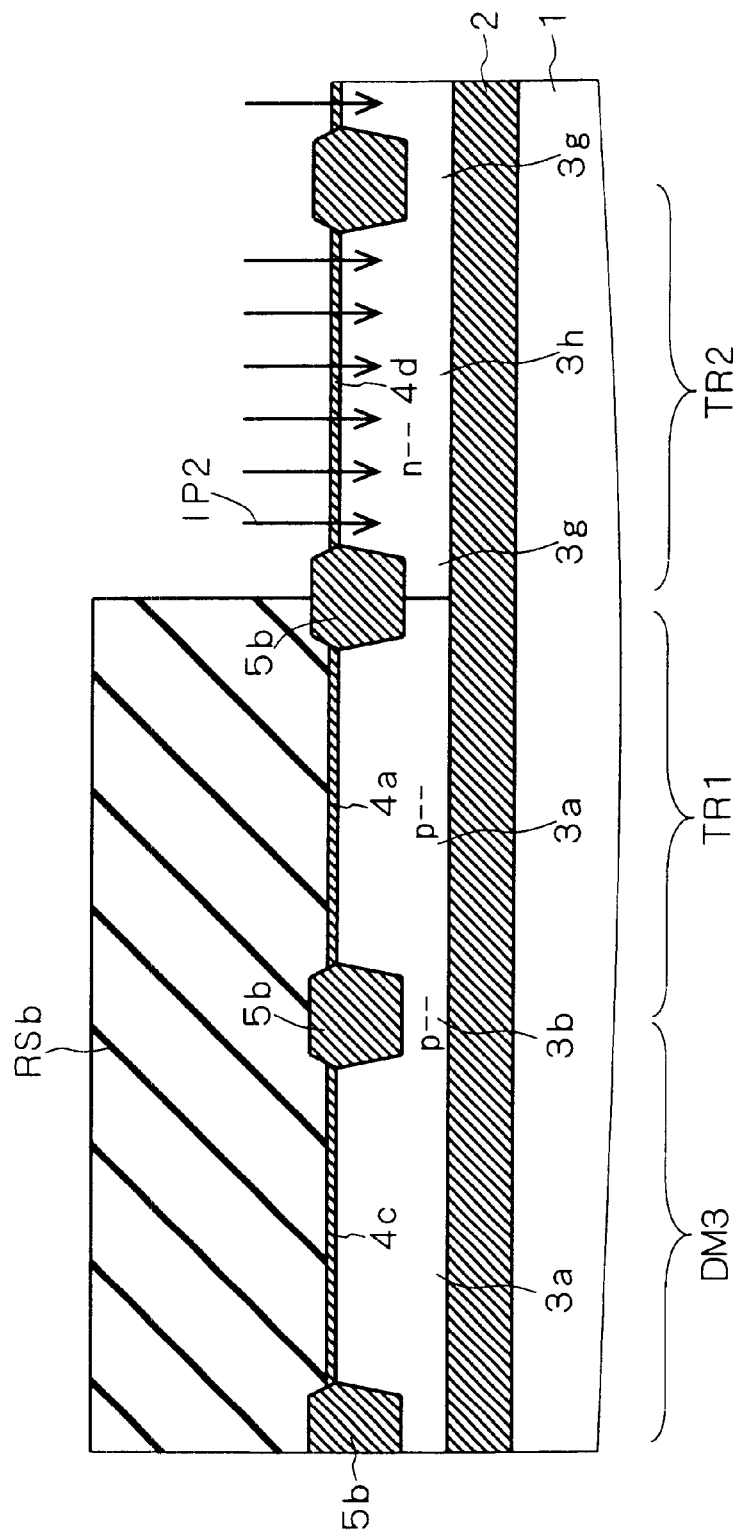

Thereafter, the photoresist RSa is removed to form a photoresist RSb in the dummy region DM3 and the MOS transistor TR1 region. The photoresist RSb is used as a mask for impurity injection. Similarly, an impurity IP2 such as P, As or Sb is injected into the silicon layer 3 of the MOS transistor TR2 region. Consequently, an n-type well is formed (FIG. 31). Silicon layers 3g and 3h form a part of the n-type well.

The p-type well and the n-type well have impurity concentrations of approximately $1\times10^{15}$ to $1\times10^{19}$ $cm^{-2}$, for example.

Subsequently, gate electrodes 7a, 7c and 7d are formed. Before the formation, the gate insulating films 4a, 4c and 4d may be removed such that new gate insulating films 4a, 4c and 4d are provided by thermal oxidation and deposition. Moreover, a nitrogen oxide film, a metal oxide film such as $Al_2O_3$, a high dielectric constant oxide film such as $Ta_2O_5$ or the like may be used as the new gate insulating films 4a, 4c and 4d.

First of all, a material of a gate electrode such as polycrystalline silicon is deposited in a thickness of approximately 100 to 400 nm by using the LPCVD system, for example. The polycrystalline silicon may be doped with an impurity such as P or B. Moreover, a metal material such as W, Ta or Al, as well as the polycrystalline silicon, may be used as the material of the gate electrode.

Next, the material of the gate electrode is subjected to patterning by photolithography. In this case, an oxide film or a multilayer structure of an oxide film and a nitride film, as well as a photoresist, may be used as a mask layer for patterning the material of the gate electrode. After the patterning is completed, the mask layer is removed.

Then, a pocket region is formed. The pocket region serves to suppress a short channel effect generated through microfabrication. The short channel effect is also influenced by the conditions such as a depth of a pn junction interface in a drain region and a source region, a dimension of the gate insulating film and the like. Accordingly, in the case in which the conditions can be optimized and the short channel effect can be suppressed, the pocket region does not need to be formed.

Figure 32:
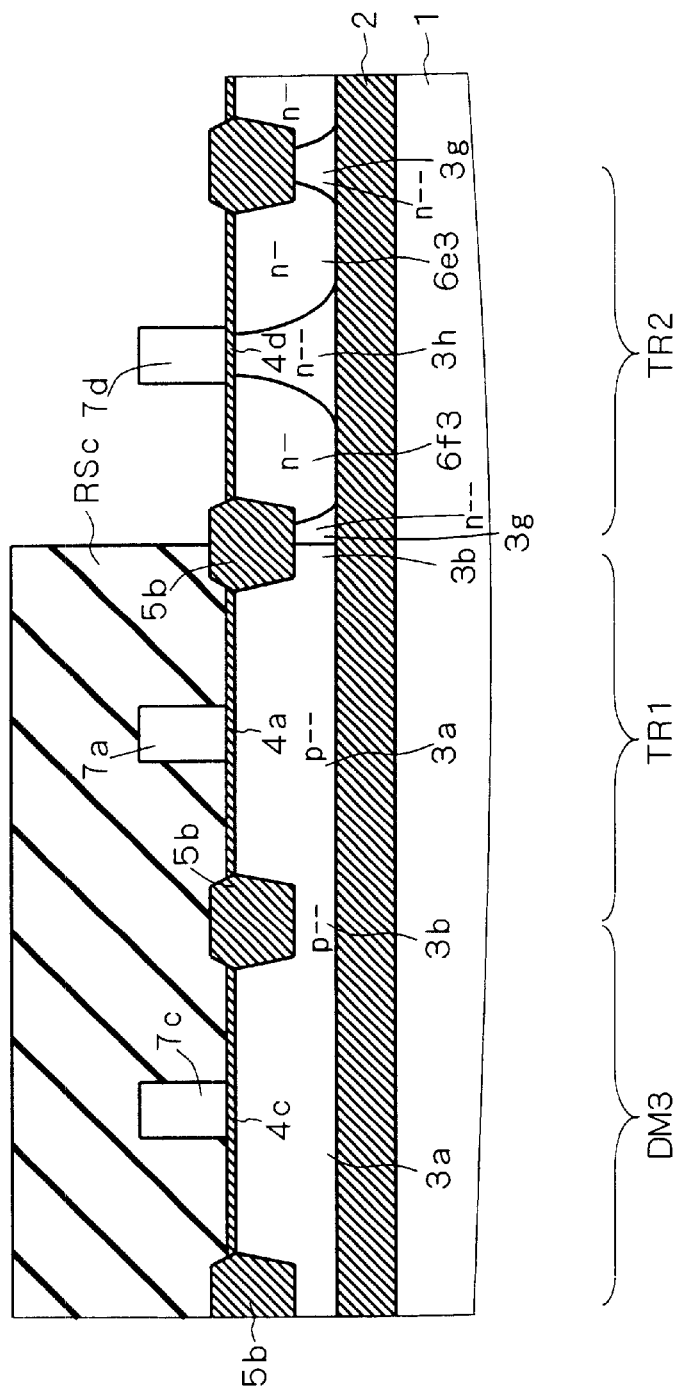

First of all, pocket regions 6e3 and 6f3 of the MOS transistor TR2 are formed. As shown in FIG. 32, a photoresist RSc is formed in a region in which the p-type well is provided. For example, As, P, Sb or the like is injected by using the photoresist RSc, the gate electrode 7d and the partial isolating film 5b as masks, and the pocket regions 6e3 and 6f3 are formed to have an impurity concentration of approximately $1 \times 10^{12}$ to $1 \times 10^{14}$ cm$^{-2}$, for example.

After the photoresist RSc is removed, a photoresist RSd is newly formed and pocket regions 6a3 and 6b3 of the MOS transistor TR1 are formed. More specifically, B, BF$_2$, In or the like is injected by using the photoresist RSd, the gate electrode 7a and the partial isolating film 5b as masks, and the pocket regions 6a3 and 6b3 are formed to have an impurity concentration of approximately $1 \times 10^{12}$ to $1 \times 10^{14}$ cm$^{-2}$, for example.

Figure 33:
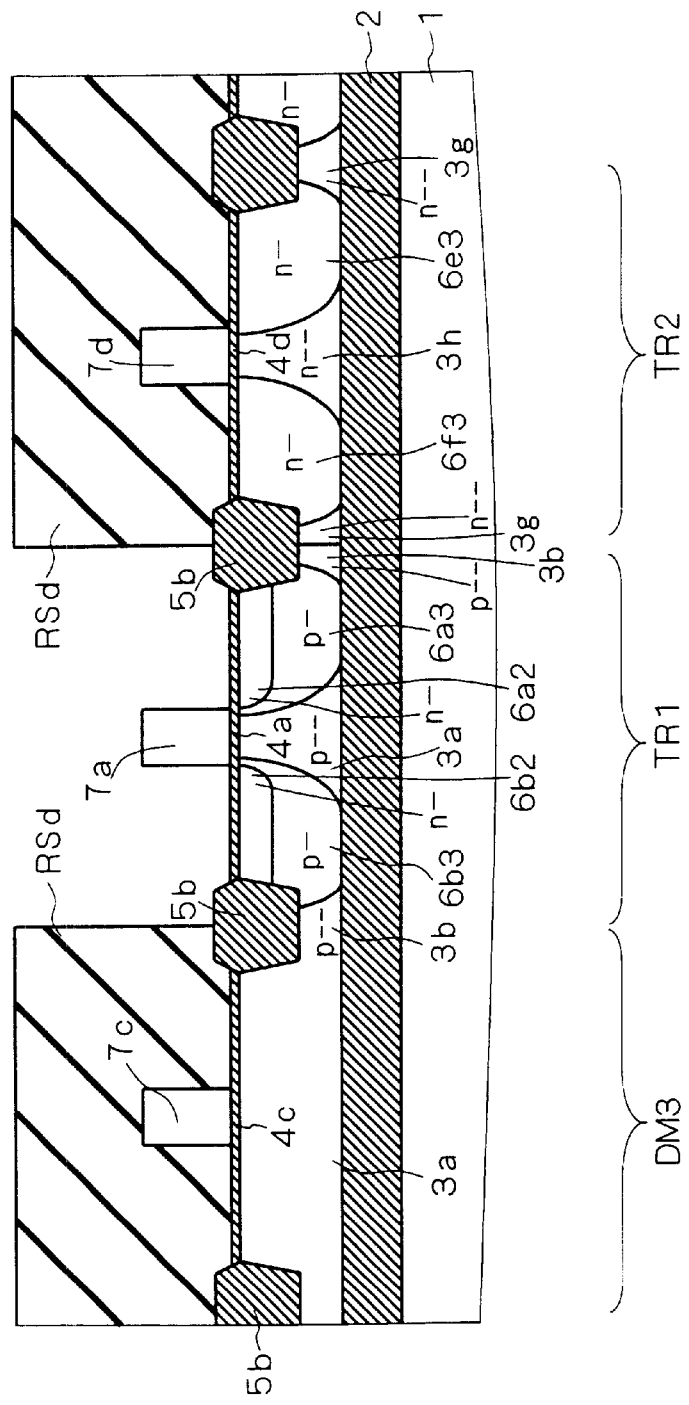

Subsequently, extension regions 6a2 and 6b2 are formed. For example, As, P, Sb or the like is injected by using the photoresist RSd, the gate electrode 7a and the partial isolating film 5b as masks. Consequently, the extension regions 6a2 and 6b2 are formed to have an impurity concentration of approximately $1 \times 10^{13}$ to $1 \times 10^{15}$ cm$^{-2}$, for example (FIG. 33).

Figure 34:
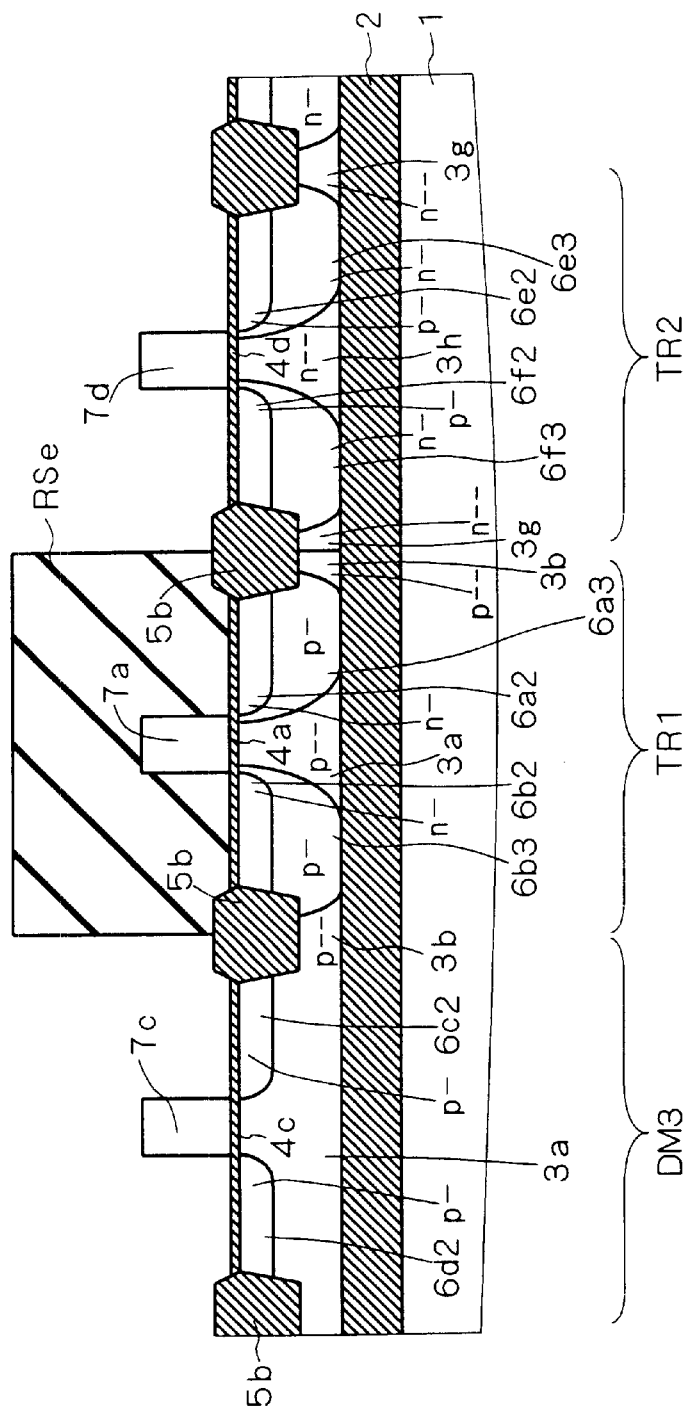

After the photoresist RSd is removed, a photoresist RSe is newly formed and extension regions 6c2, 6d2, 6e2 and 6f2 of the dummy region DM3 and the MOS transistor TR2 are formed. For example, B, BF$_2$, In or the like is injected by using the photoresist RSe, the gate electrodes 7c and 7d and the partial isolating film 5b as masks, and the extension regions 6c2, 6d2, 6e2 and 6f2 are formed to have an impurity concentration of approximately $1 \times 10^{13}$ to $1 \times 10^{15}$ cm$^{-2}$, for example (FIG. 34).

Thereafter, the photoresist RSe is removed to form a side wall 8. A TEOS oxide film, a plasma oxide film or the like may be used as a side wall film. Moreover, Si$_3$N$_4$ or a multilayer structure of Si$_3$N$_4$ and SiO$_2$ formed by the LPCVD method or the plasma CVD method may be used as the side wall film. After the side wall film is deposited, etch back is carried out to form the side wall 8.

Figure 35:
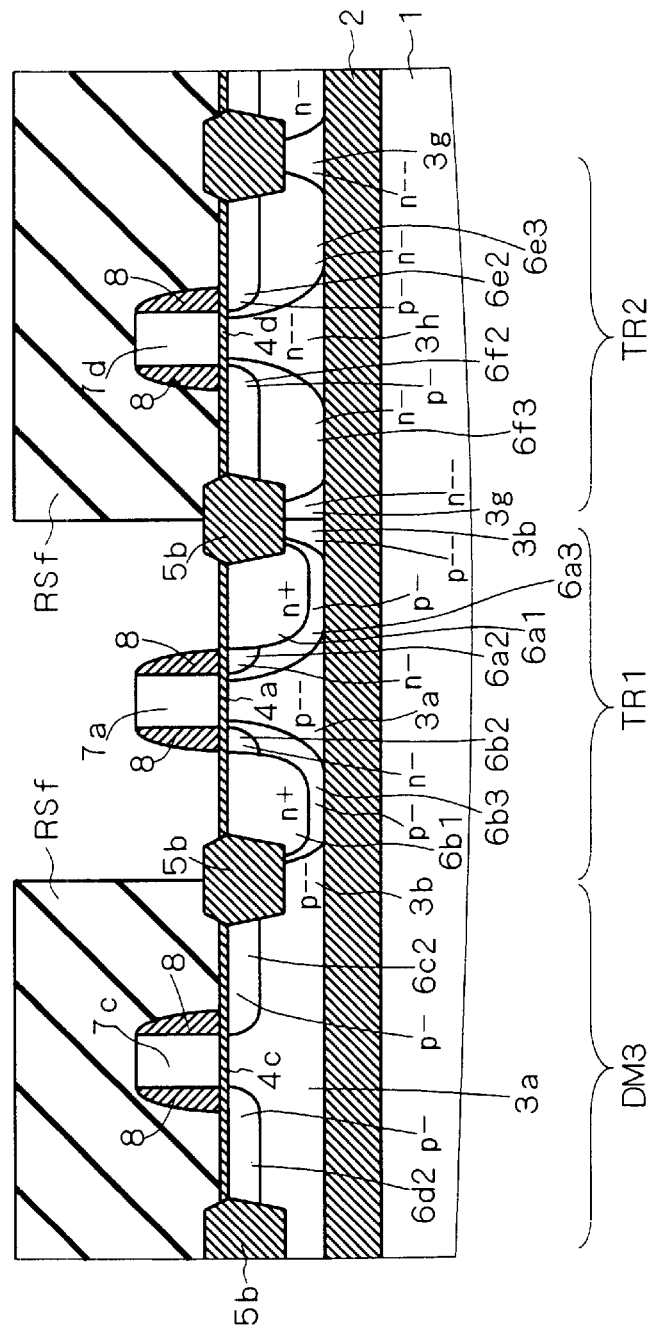

Subsequently, a photoresist RSf is formed on the MOS transistor TR2 and the dummy region DM3. For example, As, P, Sb or the like is injected by using the photoresist RSf, the gate electrode 7a, the side wall 8 and the partial isolating film 5b as masks, and a drain region 6a1 and a source region 6b1 are formed to have an impurity concentration of approximately $1 \times 10^{14}$ to $1 \times 10^{16}$ cm$^{-2}$, for example (FIG. 35).

Figure 36:
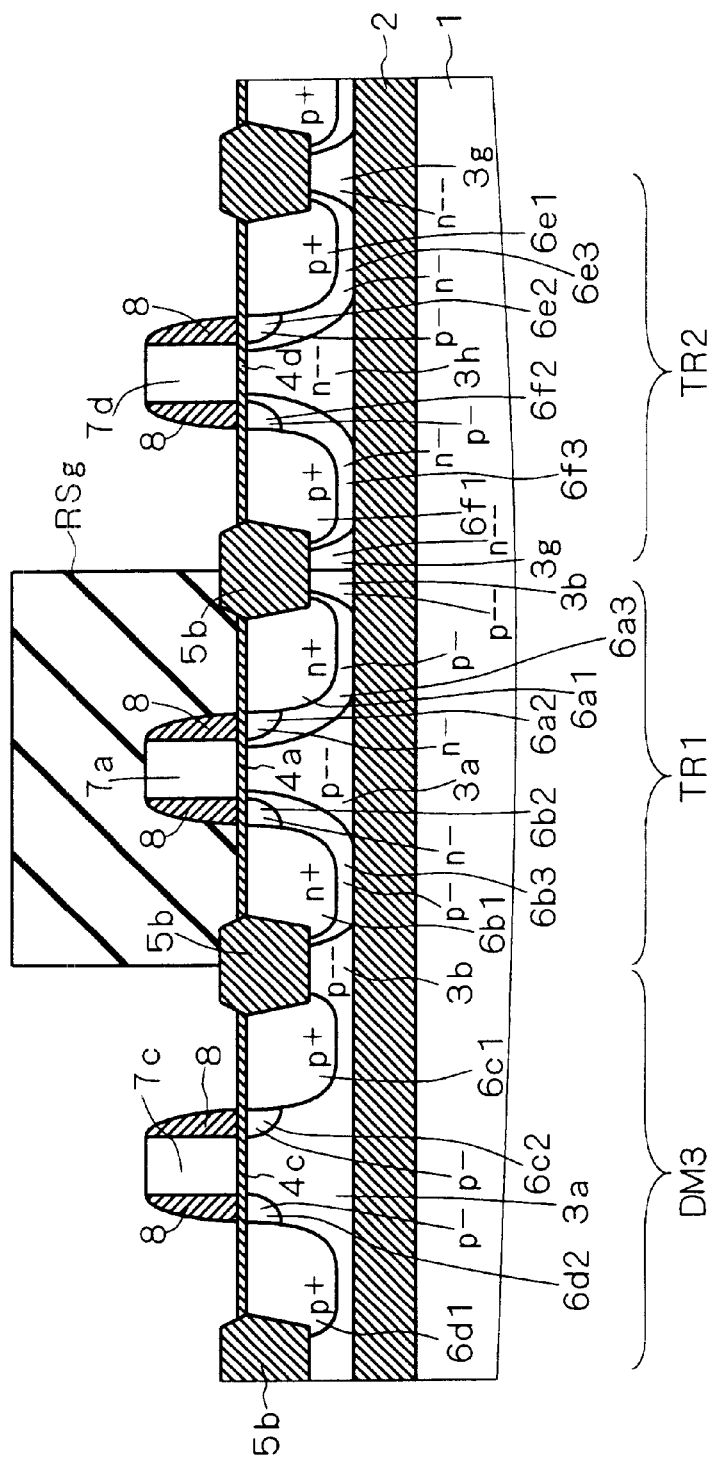

Next, the photoresist RSf is removed and a photoresist RSg is newly formed. A dummy drain region 6c1, a dummy source region 6d1, a drain region 6e1 and a source region 6f1 of the dummy region DM3 and the MOS transistor TR2 are formed. More specifically, B, BF$_2$, In or the like is injected by using the photoresist RSg, the gate electrodes 7c and 7d and the partial isolating film 5b as masks, and the dummy drain region 6c1, the dummy source region 6d1, the drain region 6e1 and the source region 6f1 are formed to have an impurity concentration of approximately $1 \times 10^{14}$ to $1 \times 10^{16}$ cm$^{-2}$, for example (FIG. 36). Then, the photoresist RSg is removed and annealing (800 to 1150° C.) for the activation of the source region and the drain region is carried out.

In the sectional views prior to FIG. 24, the pocket region and the extension region have been omitted to prevent the drawings from being complicated. However, it is desirable that these regions should be actually formed as described above.

Next, the gate insulating films 4a, 4c and 4d on the dummy drain region 6c1, the dummy source region 6d1, the drain regions 6a1 and 6e1 and the source regions 6b1 and 6f1 where silicidation is to be carried out are removed. Thus, the silicidation of the above-mentioned portions and the gate electrodes 7a, 7c and 7d is carried out (FIG. 37).

Figure 37:
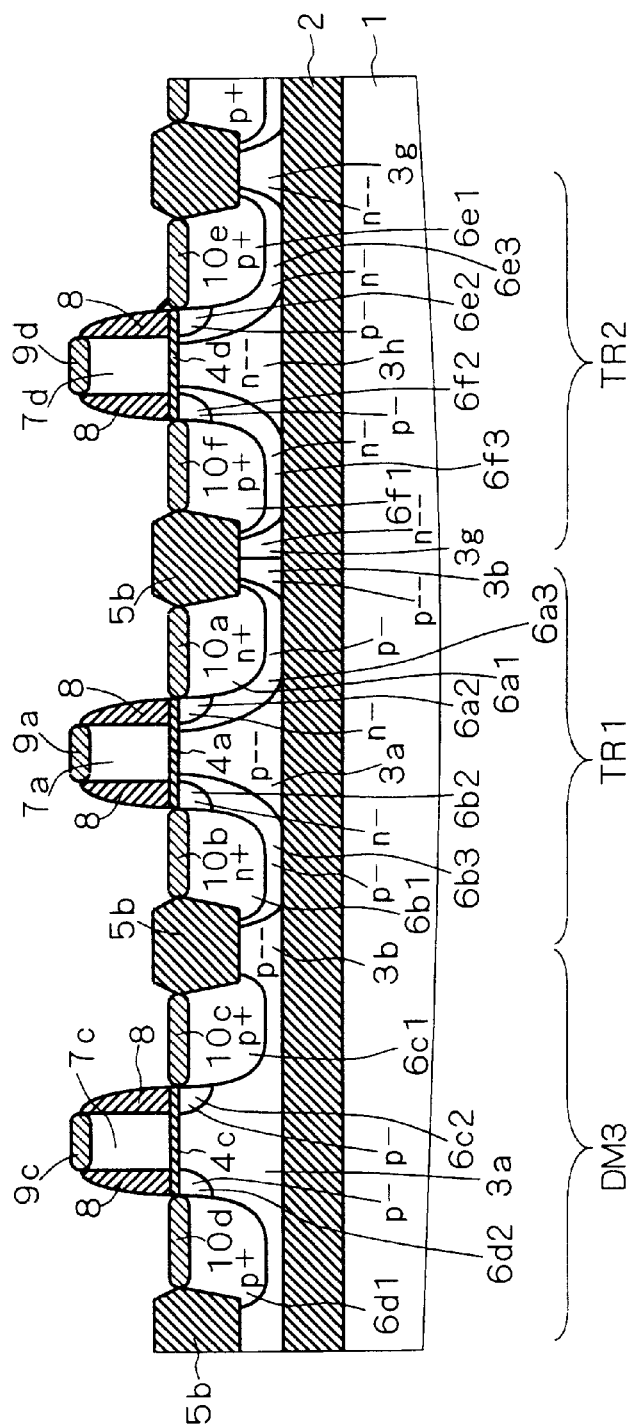

FIG. 37 illustrates the case in which a salicide process for carrying out the silicidation on all of a source, a drain and a gate is performed. Of course, it is also supposed that a polycide process for carrying out the silicidation on only a gate electrode or the silicidation is not carried out on any of the source, the drain and the gate to be used for ESD (Electro-Static Discharge). In a portion in which the silicidation is not carried out, a silicide protection oxide film or the like may be formed. Examples of the silicide include TiSi$_2$, CoSi$_2$, NiSi$_2$, WSi$_2$, TaSi$_2$, MoSi$_2$, HfSi$_2$, Pd$_2$Si, PtSi, ZrSi$_2$ and the like.

Next, an interlayer insulating film, a contact plug and a wiring are formed. First of all, an interlayer insulating film 11 is deposited in a thickness of approximately 1 µm over the whole surface of the substrate. Then, a CMP treatment is carried out to flatten the interlayer insulating film 11.

Figure 38:
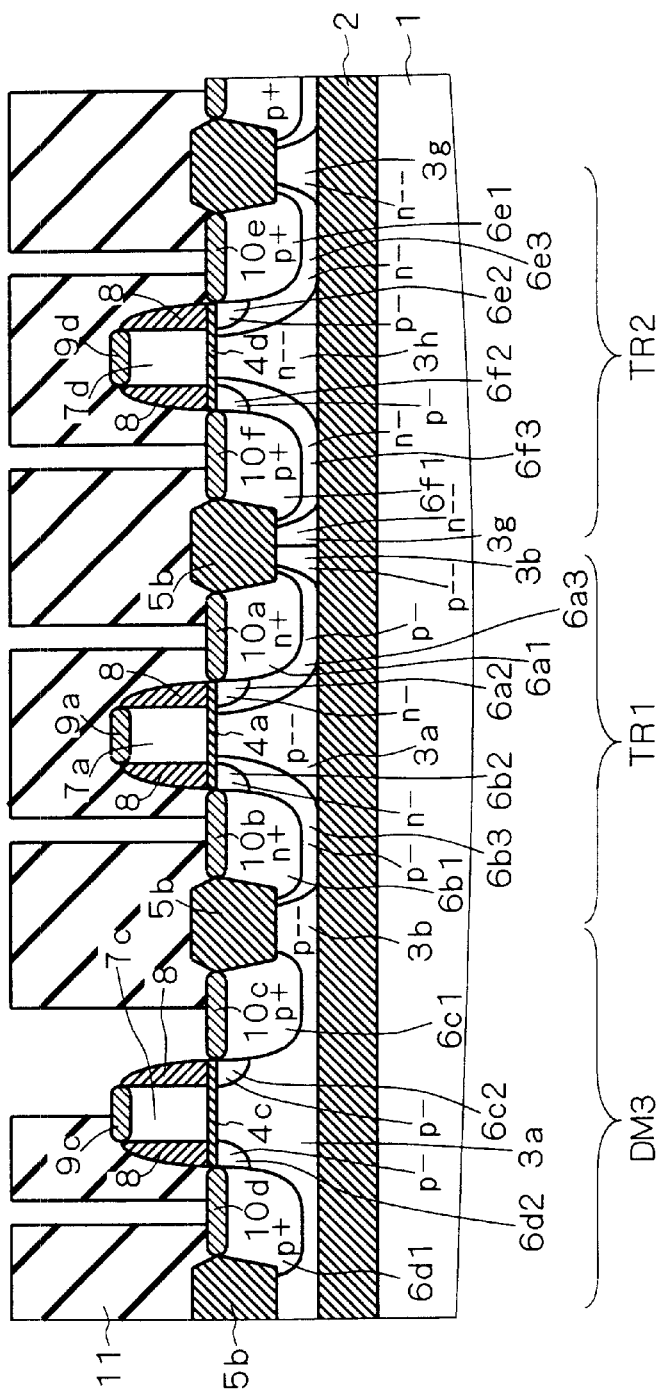

Then, a trench for a contact plug is formed on the interlayer insulating film 11 by photolithography in order to form the contact plug (FIG. 38).

Thereafter, a conductive material, for example, a metal film such as W is formed to be fully buried in the trench for the contact plug. Al, TiN, doped polycrystalline silicon and the like may be used in place of W.

Examples of a method of forming a conductive material like a film such as W include a blanket CVD method and a selective CVD method. For Al, a high temperature sputtering method and a reflow sputtering method are used, for example. For TiN and doped polycrystalline silicon, the LPCVD method is used, for example. In order to enhance adhesion between W and the interlayer insulating film 11 to be a lower layer, Ti, TiN, TiW or the like may be formed before W is deposited. By taking W as an example, description will be given to the case in which the blanket CVD method is employed.

Figure 39:
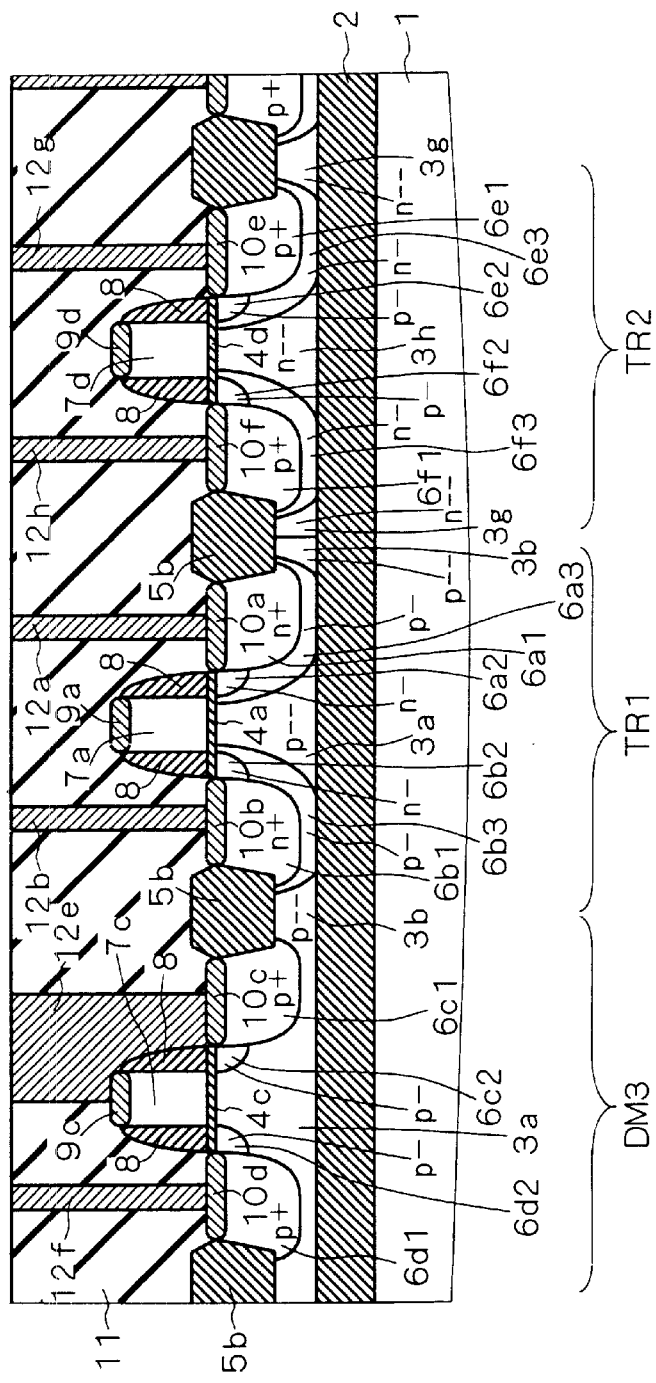

First of all, a W film is formed over the whole surface of the substrate, and is flattened by etch back (FIG. 39).

Next, wirings 13a, 13b, 13e, 13f, 13g and 13h to be first layers are formed. For example, an Al film is employed for a material, and is formed on the interlayer insulating film 11 and each contact plug. For example, AlCuSi, Cu or doped polycrystalline silicon may be used for the material in place of Al.

Figure 40:
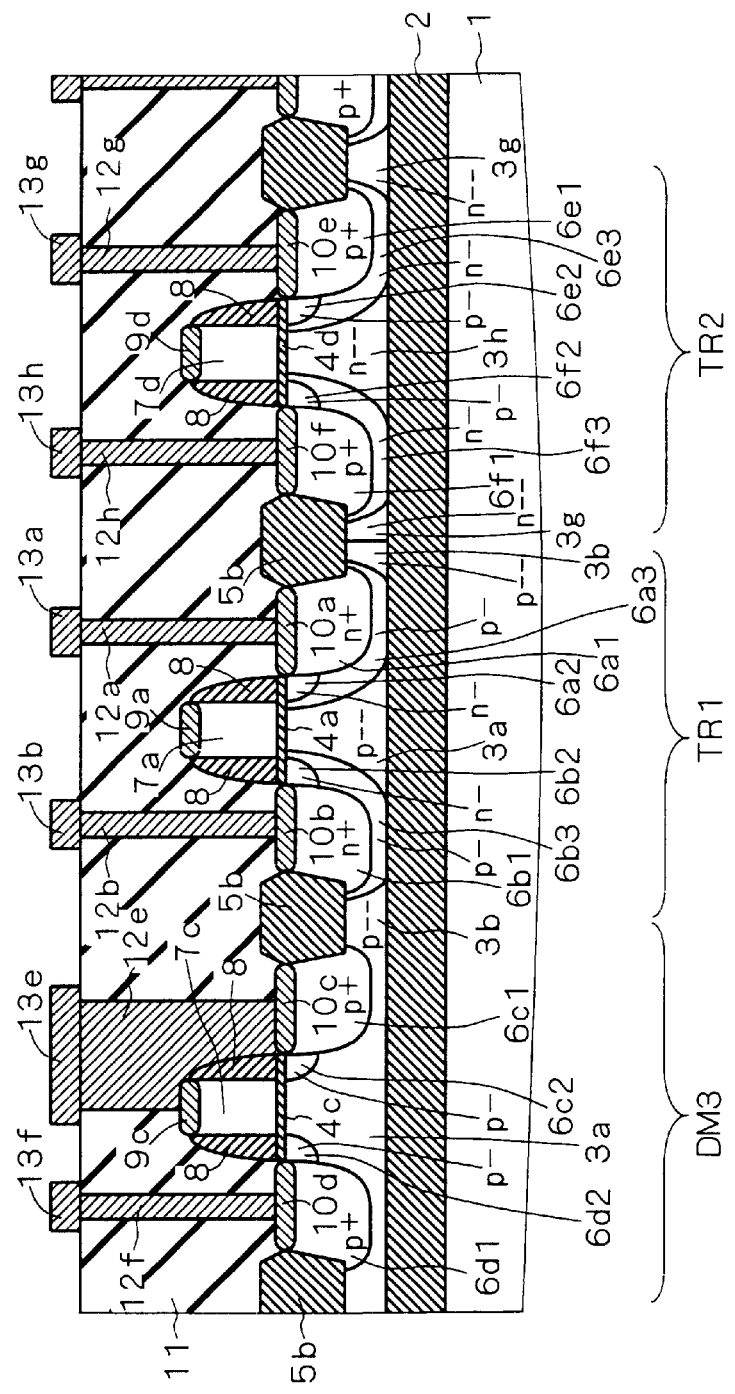

The material of the wiring to be the first layer is subjected to patterning by using the photolithography (FIG. 40).

Next, an interlayer insulating film 14 to be an upper layer is formed on the wiring to be the first layer. In the same manner as the interlayer insulating film 11, flattening is carried out by the CMP treatment. Then, via holes to be connected to the wirings 13a and 13g are formed in the interlayer insulating film 14, for example.

In the same manner as the wiring to be the first layer, a conductive material, for example, a metal film such as W is formed to be fully buried in the via hole, and is subjected to patterning to form a via plug 19. Wirings 15a to 15f to be second wirings are formed.

Figure 41:
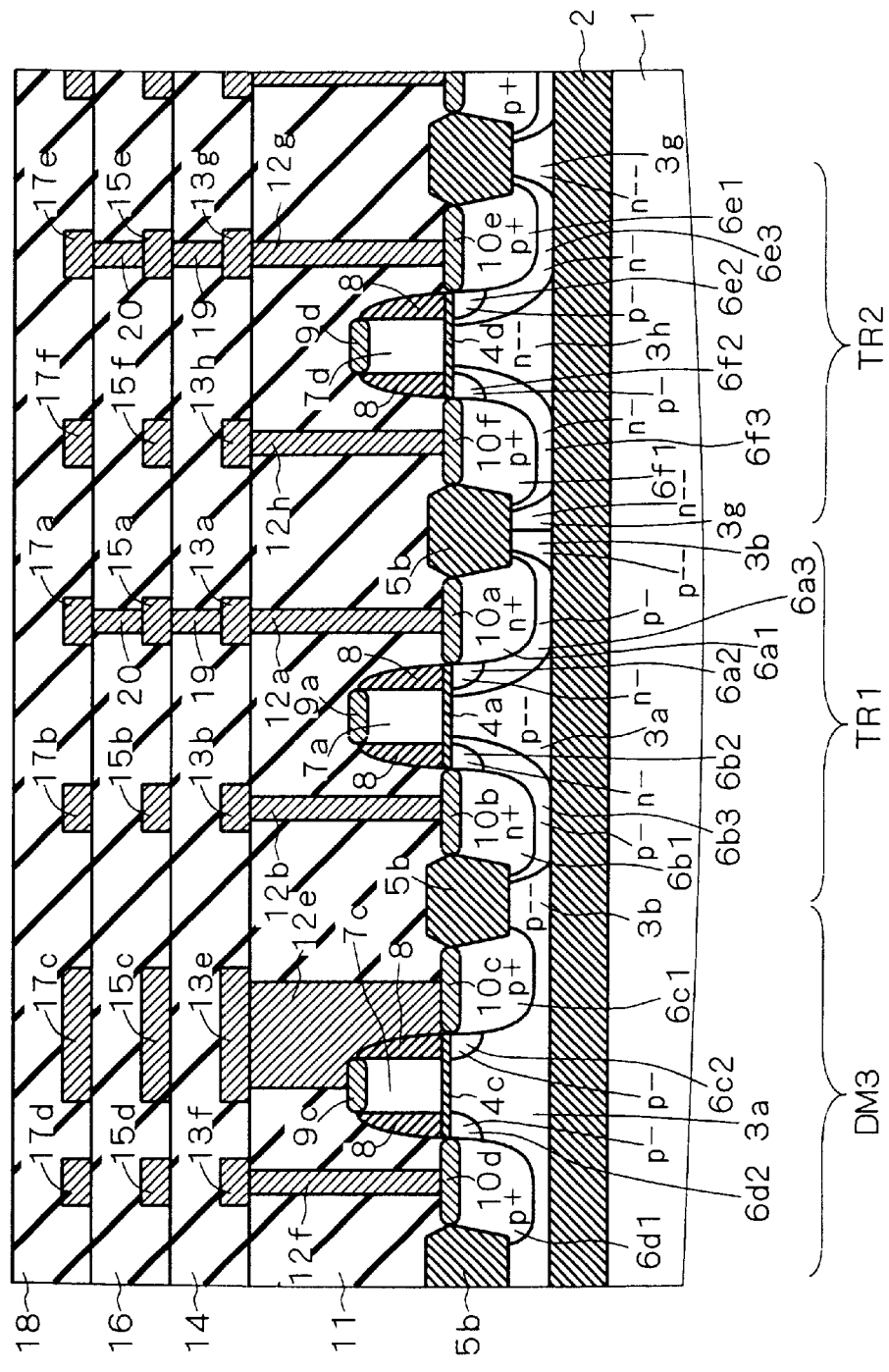

Subsequently, an interlayer insulating film 16 to be an upper layer, a via plug 20 and wirings 17a to 17f to be third layers are formed in the same manner. Then, a passivation film 18 for chip protection is formed as an uppermost layer (FIG. 41).

Through the above-mentioned processes, the SOI device according to the sixth embodiment is formed.

Figure 42:
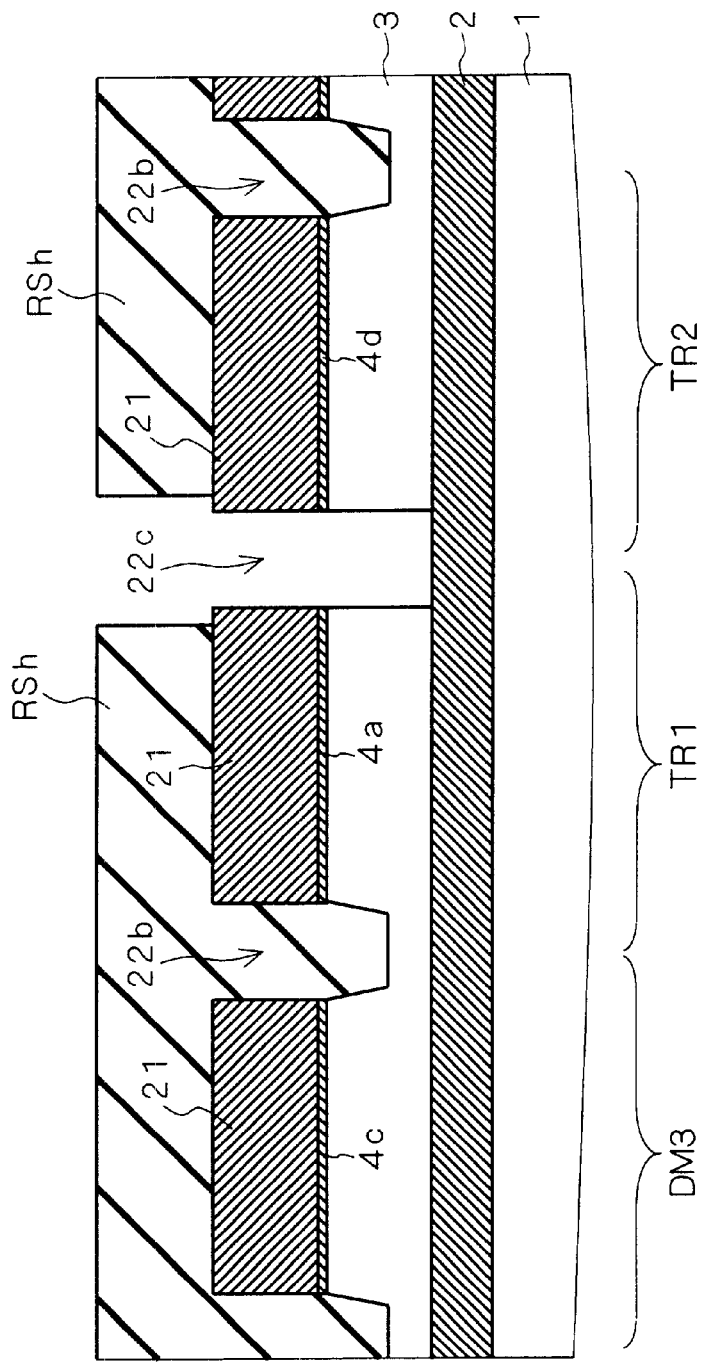

In the case in which the structure having the complete isolating film according to the ninth or eleventh embodiment is to be manufactured, it is preferable that a step of forming a trench 22c having such a structure that the trench 22b reaches the buried insulating film 2 should be added as shown in FIG. 42 after the step of FIG. 27. In other words, etching is carried out by using a photoresist RSh having an opened portion to be the complete isolating film so that the trench 22c is formed.

Subsequently, a material of the partial isolating film and the complete isolating film such as an oxide film is provided to fully bury the trenches 22b and 22c. A plasma TEOS oxide film or the like formed by using an HDP system, for example, may be used for the material.

Figure 43:
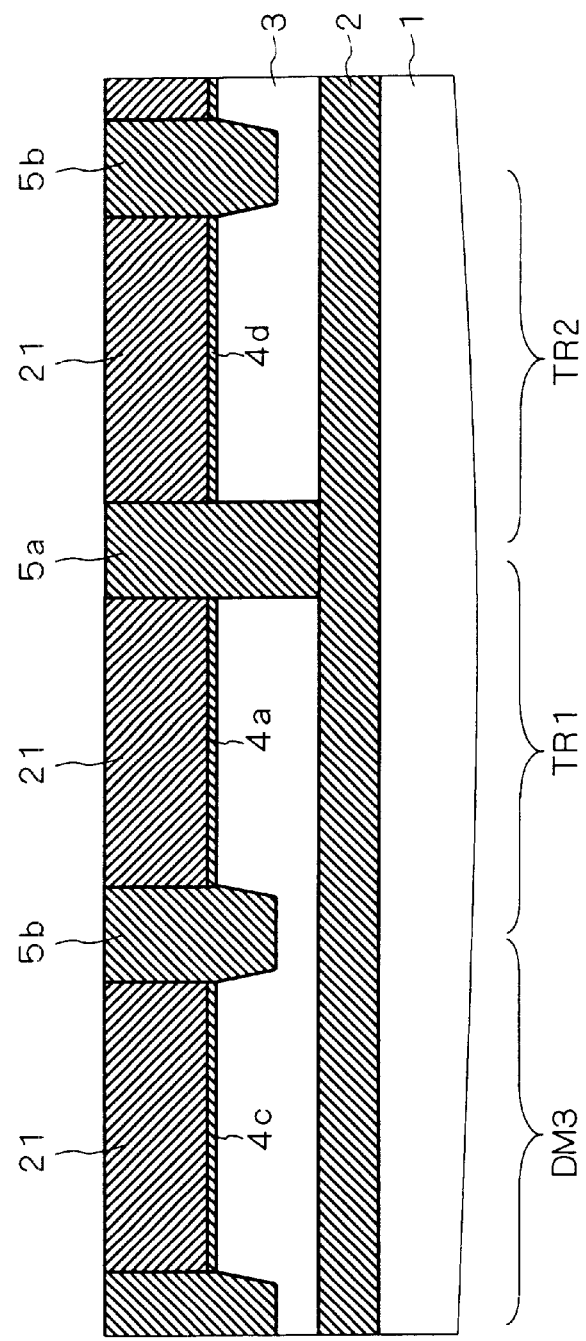

The surface is flattened by the CMP method (FIG. 43). Then, a heat treatment is carried out at a temperature of approximately 1000 to 1100° C. to enhance the quality of the material of a deposited film. If a high temperature heat treatment is carried out at approximately 900 to 1000° C. to round corner portions of upper parts and bottoms of the trenches 22b and 22c before the materials of the partial isolating film and the complete isolating film are deposited, a tensile stress of the material deposited as the partial isolating film 5b and the complete isolating film can be reduced effectively.

Figure 44:
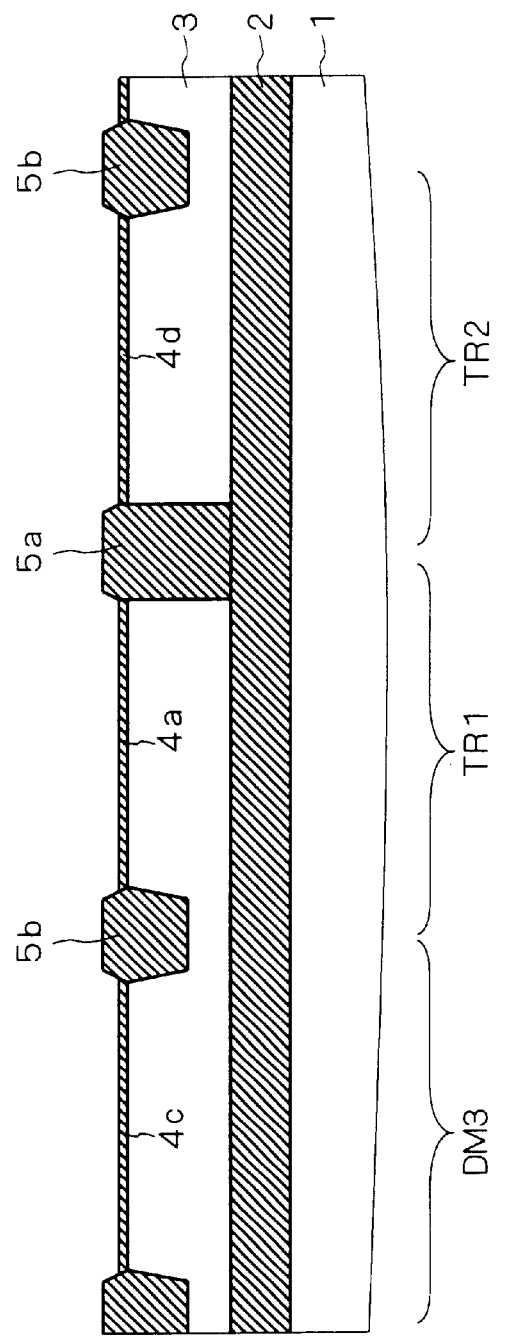
Figure 45:
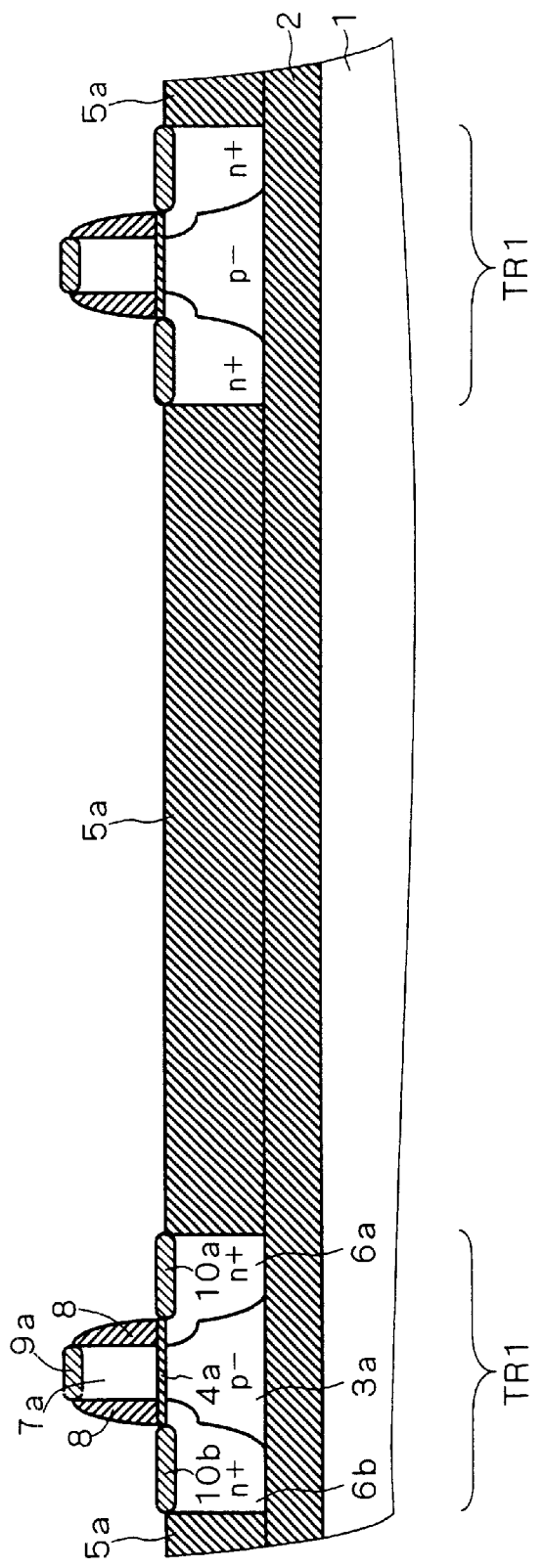
FIG. 45 is a sectional view showing a conventional SOI device.
Figure 46:
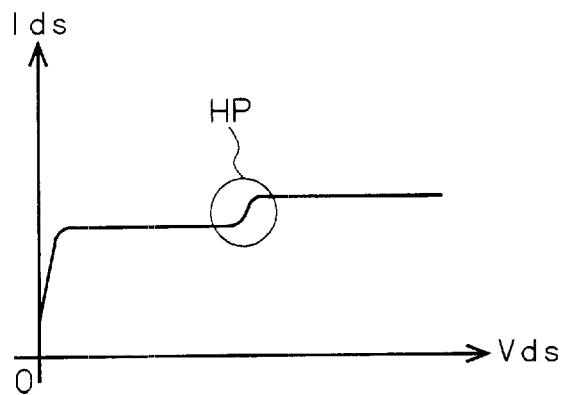
FIG. 46 is a chart showing a current-voltage characteristic of the conventional SOI device.
Figure 47:
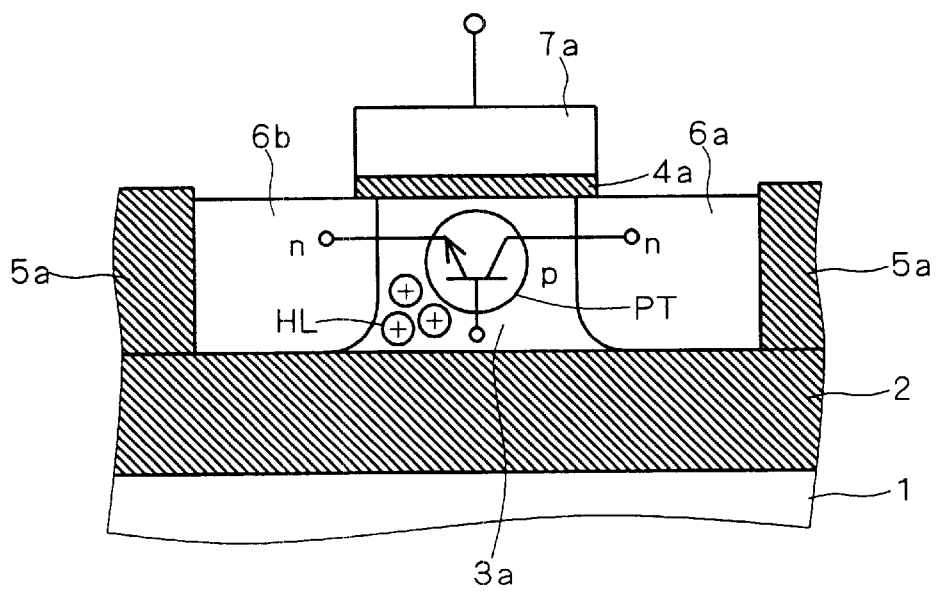
FIG. 47 is a view showing drawbacks of the conventional SOI device.

Next, the partial isolating film 5b and the complete isolating film 5a are etched back by wet etching or using the RIE system or the ECR system, and heights of surfaces of the partial isolating film 5b and the complete isolating film 5a are adjusted. Then, the mask layer 21 is removed with high temperature phosphoric acid, for example (FIG. 44).

Preferably, the subsequent processes are carried out in the same manner as those in and after FIG. 30.

By using the method of manufacturing the SOI device according to the present embodiment, the MOS transistors TR1 and TR2 and the dummy region DM3 are formed at the same time. Therefore, a new step of providing a dummy region is not required and a layout of a conventional photomask is only changed, which is economical.

The present embodiment is not restricted to the method of manufacturing the SOI device according to the fifth or sixth embodiment but can be applied to each of the above-mentioned other embodiments by modifying the method of manufacturing the SOI device according to the fifth or sixth embodiment.

Referring to the SOI device according to the first or second embodiment, if the gate electrode 7c is not provided in FIG. 32, the SOI device according to the first or second embodiment can be manufactured by carrying out the subsequent steps.

Referring to the SOI device according to the third or fourth embodiment, if the gate electrode 7c is provided to reach the two partial isolating films 5b interposing the dummy region DM3 therebetween in FIG. 32, the SOI device according to the third or fourth embodiment can be manufactured by carrying out the subsequent steps.

Referring to the SOI device according to the seventh or eighth embodiment, when a proper pattern for the photomask is employed to provide the gate electrode 7c in FIG. 32, the SOI device according to the seventh or eighth embodiment can be manufactured by carrying out the subsequent steps.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   an SOI substrate having a substrate, a buried insulating film formed on said substrate, and a semiconductor layer formed on said buried insulating film;
   a partial isolating film to be an insulating film formed in the vicinity of a surface of said semiconductor layer in no contact with said buried insulating film;
   a semiconductor element formed including a part of said semiconductor layer; and
   a dummy region having no function as an element which is formed including another part of said semiconductor layer;
   wherein said partial isolating film is interposed between said semiconductor element and said dummy region.

2. The semiconductor device according to claim 1, further comprising
   a complete isolating film to be an isolating film formed in contact with said buried insulating film through said semiconductor layer; and
   a dummy region having no function as an element which is formed including another part of said semiconductor layer;
   wherein said complete isolating film is interposed between said semiconductor element and said dummy region.

3. The semiconductor device according to claim 1, wherein
   an impurity of a predetermined conductivity type is injected into said semiconductor layer of said dummy region.

4. The semiconductor device according to claim 3, wherein
   a well of said predetermined conductivity type is formed in said semiconductor layer, and
   said semiconductor layer of said dummy region is a part of said well.

5. The semiconductor device according to claim 1, wherein
   a dummy wiring is connected to a surface of said semiconductor layer of said dummy region.

6. The semiconductor device according to claim 3, wherein
   said dummy region includes a dummy gate having a dummy gate insulating film formed on a surface of said another part of said semiconductor layer and a dummy gate electrode formed on said dummy gate insulating film.

7. The semiconductor device according to claim 6, wherein
   a fixed voltage is applied to said dummy gate electrode.

8. The semiconductor device according to claim 6, wherein
   said dummy gate is partially provided on said another part of said semiconductor layer, and
   an impurity of said predetermined conductivity type is injected to a portion of said another part of said semiconductor layer which is not covered with said dummy gate.

9. The semiconductor device according to claim 8, further comprising
   a dummy contact plug electrically connected to said semiconductor layer and said dummy gate electrode in said dummy region; and
   a dummy wiring connected to said dummy contact plug.

10. The semiconductor device according to claim 6, wherein
    said dummy gate has a cross shape, and
    said semiconductor layer of said dummy region constitutes a parallelogram having four sides parallel with each side forming said cross shape of said dummy gate.

* * * * *